(12) United States Patent
Chu et al.

(10) Patent No.: US 11,996,298 B2
(45) Date of Patent: May 28, 2024

(54) REVERSED TONE PATTERNING METHOD FOR DIPOLE INCORPORATION FOR MULTIPLE THRESHOLD VOLTAGES

(71) Applicant: Taiwan Semiconductor Manufacturing Co., Ltd., Hsinchu (TW)

(72) Inventors: Lung-Kun Chu, Hsinchu (TW); Jia-Ni Yu, Hsinchu (TW); Chun-Fu Lu, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/890,980

(22) Filed: Aug. 18, 2022

(65) Prior Publication Data

US 2023/0360926 A1   Nov. 9, 2023

Related U.S. Application Data

(60) Provisional application No. 63/337,912, filed on May 3, 2022.

(51) Int. Cl.
*H01L 21/00* (2006.01)
*H01L 21/475* (2006.01)
*H01L 21/4757* (2006.01)
*H01L 21/477* (2006.01)
*H01L 27/088* (2006.01)

(52) U.S. Cl.
CPC .......... *H01L 21/477* (2013.01); *H01L 21/475* (2013.01); *H01L 21/47573* (2013.01); *H01L 27/0886* (2013.01)

(58) Field of Classification Search
CPC ............ H01L 29/0665; H01L 29/0673; H01L 29/42392; H01L 29/66545
See application file for complete search history.

(56) References Cited

U.S. PATENT DOCUMENTS

| | | | |
|---|---|---|---|
| 7,790,553 B2 | 9/2010 | Zhu et al. | |
| 2007/0052036 A1 | 3/2007 | Luan et al. | |
| 2019/0371903 A1 | 12/2019 | Bao et al. | |
| 2020/0373300 A1* | 11/2020 | Zhang | H01L 29/78696 |
| 2021/0134950 A1 | 5/2021 | Hsu et al. | |

* cited by examiner

*Primary Examiner* — Reema Patel
(74) *Attorney, Agent, or Firm* — Seed IP Law Group

(57) ABSTRACT

A method for processing an integrated circuit includes forming a plurality of transistors. The method utilizes a reversed tone patterning process to selectively drive dipoles into the gate dielectric layers of some of the transistors while preventing dipoles from entering the gate dielectric layers of other transistors. This process can be repeated to produce a plurality of transistors each having different threshold voltages.

20 Claims, 20 Drawing Sheets

REVERSED TONE PATTERNING METHOD FOR DIPOLE INCORPORATION FOR MULTIPLE THRESHOLD VOLTAGES

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to include transistors that have different threshold voltages.

The formation of an integrated circuit that includes multiple transistors with different threshold voltages may be challenging. For 3D transistors such as FinFET transistors and gate all around (GAA) transistors, the patterning processes to define different regions of the integrated circuit may be difficult. High K gate dielectric structures and channel regions may be damaged due to the patterning process. The result of this is that the threshold voltages of the various device regions may not be in accordance with design specifications. This can lead to nonfunctioning transistors, poor wafer yields, and electronic devices that do not function properly. The threshold voltage of the resulting device regions may not be accurate as designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
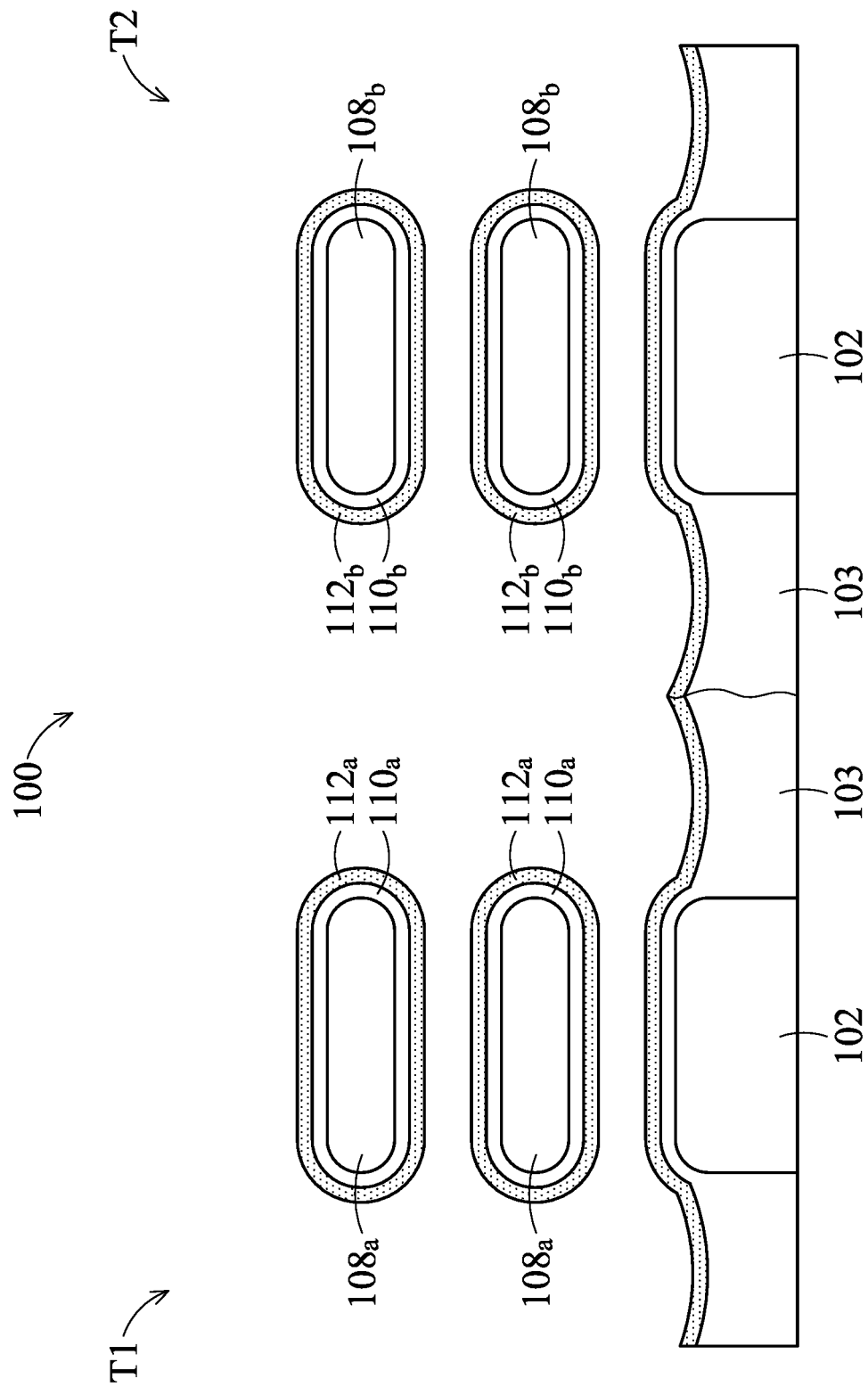
FIGS. 1A-1J are cross-sectional diagrams of an integrated circuit at various stages of processing, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with multiple regions of the transistor formation with different threshold voltages. In particular, embodiments of the present disclosure utilize reversed tone patterning to safely and effectively perform dipole drive-in processes that do not significantly damage the high K gate dielectric layers. Embodiments of the present disclosure can utilize combinations of reversed tone and positive tone patterning in order to form the multiple threshold voltage regions. The result is effective and efficient formation of multiple threshold voltage regions the falcon specified tolerances. This leads to properly functioning integrated circuits, higher wafer yields, and better functioning electronic devices.

As used herein, a reversed tone patterning process for dipole drive-in can include forming a hard mask layer prior to depositing a dipole inducing layer. In particular, the hard mask is formed patterned prior to depositing the dipole inducing layer. The patterning of the hard mask exposes a high-K gate dielectric layer at those locations at which the hard mask is removed. The dipole inducing layer is then deposited on both the hard mask and the exposed high-K gate dielectric layer. A drive-in process subsequently drives the dipoles into those locations at which no hard mask remains.

In one example, a positive tone patterning process can include forming the dipole inducing layer on the high-K gate dielectric and then a hard mask is formed on the dipole inducing layer. The hard mask layer is then patterned. The dipole inducing layer is removed where the hard mask layer is removed. The dipole inducing layer only remains below the remaining portion of the dipole inducing layer. A drive in process is then performed to drive in the dipoles at the locations where the hard mask (and the dipole inducing layer) remain.

FIG. 1A is a cross-sectional view of an integrated circuit 100 at an intermediate stage of processing, in accordance with some embodiments. In FIG. 1A, transistors T1 and T2 are at an intermediate stage of processing. As will be set forth in more detail below, the process for forming the integrated circuit 100 results in transistors T1 and T2 having different threshold voltages.

The transistors T1 and T2 may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistors may each include a plurality of semiconductor nanostructures corresponding to channel regions of the transistors. The semiconductor nanostructures may include nanosheets, nanowires, or other types of nanostructures. The gate all around transistors may also be termed nanostructure transistors.

The transistors T1 and T2 are formed in the same integrated circuit 100, though they may be located at different regions of the integrated circuit 100. As will be set forth in more detail below, the transistor T1 will incorporate dipole drive-in, while the transistor T2 will not incorporate dipole drive-in. This results in the transistors T1 and T2 having different threshold voltages.

The integrated circuit 100 includes a semiconductor substrate 102. In one embodiment, the semiconductor substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 may include one or more insulating features, such as shallow trench isolations 103 separating the transistors T1 from the transistors T2, or separating the transistors T1 from each other and the transistors T2 from each other. The shallow trench isolation 103 can be utilized to separate groups of transistor structures formed in conjunction with the semiconductor substrate 102. The shallow trench isolation 103 can include a dielectric material. The dielectric material for the shallow trench isolation may include silicon oxide, silicon nitride, silicon oxynitride (SiON), SiOCN, SiCN, fluorine-doped silicate glass (FSG), or a low-K dielectric material, formed by LPA VD (low pressure chemical vapor deposition), plasma enhanced-CVD or flowable CVD. Other materials and structures can be utilized for the shallow trench isolation 103 without departing from the scope of the present disclosure.

The transistors T1 and T2 include many of the same types of structures and materials. Accordingly, if the transistors T1 and T2 each include a structure of a same name, the corresponding reference numbers for the transistor T1 will include the suffix "a", while the corresponding reference numbers for the transistor T2 will include the suffix "b".

The transistors T1 and T2 each include a plurality of channel regions 108a/108b. The channel regions 108a/108b correspond to channel regions of the transistors T1 and T2. Though not shown in FIG. 1A, upon completion of the transistors T1 and T2, each of the channel regions 108a/108b of the transistors T1 and T2 will extend between source/drain regions of the transistors T1 and T2. In FIG. 1A, the transistors T1 and T2 each include two vertically stacked channel regions 108a/108b. However, in practice, the transistors T1 and T2 may each include more than two vertically stacked channel regions 108a/108b. The channel regions 108a/108b may correspond to semiconductor nanostructures. The semiconductor nanostructures can include semiconductor nanosheets, semiconductor nanowires, or other types of semiconductor nanostructures.

The channel regions 108a/108b are formed over the substrate 102. The channel regions 108a/108b may include one or more layers of Si, Ge, SiGe, GaAs, InSb, GaP, GaSb, InAlAs, InGaAs, GaSbP, GaAsSb or InP. In one embodiment, the channel regions 108a/108b are the same semiconductor material as the substrate 102. Other semiconductor materials can be utilized for the channel regions 108a/108b without departing from the scope of the present disclosure.

The width of the channel regions 108a/108b can be between 5 nm and 25 nm. The thickness of the channel regions 108a/108b can be between 4 nm and 8 nm. The distance D between the channel regions 108a/108b can be between 6 nm and 15 nm. Other thicknesses and dimensions can be utilized for the channel regions 108a/108b without departing from the scope of the present disclosure.

In FIG. 1A, each channel region 108a/108b of the transistors T1 and T2 is covered by an interfacial dielectric layer 110a/110b. The interfacial dielectric layer 110a/110b may be used in order to create a good interface between the channel regions 108a/108b and subsequent dielectric layers, as will be described in further detail below. The interfacial dielectric layer 110a/110b can assist in suppressing the mobility degradation of charge carries in the channel regions 108a/108b that serve as channel regions of the transistors T1 and T2.

The interfacial dielectric layer 110a/110b can include a dielectric material such as silicon oxide, silicon nitride, or other suitable dielectric materials. The interfacial dielectric layer 110a/110b can include a comparatively low-K dielectric with respect to high-K dielectric such as hafnium oxide or other high-K dielectric materials that may be used in gate dielectrics of transistors. High-K dielectrics can include dielectric materials with a dielectric constant higher than the dielectric constant of silicon oxide. In the example of FIG. 1A, the interfacial dielectric layer 110a/110b is silicon dioxide, though other materials can be utilized without departing from the scope of the present disclosure.

The interfacial dielectric layer 110a/110b can be formed by a thermal oxidation process, a chemical vapor deposition (CVD) process, or an atomic layer deposition (ALD) process. The interfacial dielectric layer 110a/110b can have a thickness between 0.5 nm and 1.5 nm. One consideration in selecting a thickness for the interfacial dielectric layer 110a/110b is to leave sufficient space to deposit and etch various materials between the channel regions 108a/108b, as will be explained in more detail below. Other materials, deposition processes, and thicknesses can be utilized for the interfacial dielectric layer 110a/110b without departing from the scope of the present disclosure.

The transistors T1 and T2 each include, a high-K dielectric layer 112a/112b. The high K dielectric layer 112a/112b is positioned on the interfacial dielectric layer 110a/110b. The interfacial dielectric layer 110a/110b separates the high K gate dielectric layer 112a/112b from the channel regions 108a/108b. The high-K dielectric layer 112a/112b and the interfacial dielectric layer 110a/110b collectively form a gate dielectric of the transistors T1 and T2. The high-K dielectric layer 112a/112b and the interfacial dielectric layer 110a/110b physically separate the channel regions 108a/108b from the gate metals that will be deposited in subsequent steps. The high-K dielectric layer 112a/112b and the interfacial dielectric layer 110a/110b isolate the gate metals from the channel regions 108a/108b that correspond to the channel regions of the transistors.

The high-K dielectric layer 112a/112b includes one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 112a/112b may be formed by CVD, ALD, or any suitable method. In one embodiment, the high-K dielectric layer 112a/112b is formed using a highly conformal deposition process such as ALD in order to ensure the formation of a gate dielectric layer having a uniform thickness around each channel region 108. In one embodiment, the thickness of the high-k dielectric is in a range from about 1 nm to about 2 nm. Other thicknesses, deposition processes, and materials can be utilized for the high-K dielectric layer 112a/112b without departing from the scope of the present disclosure.

Figure 1B:
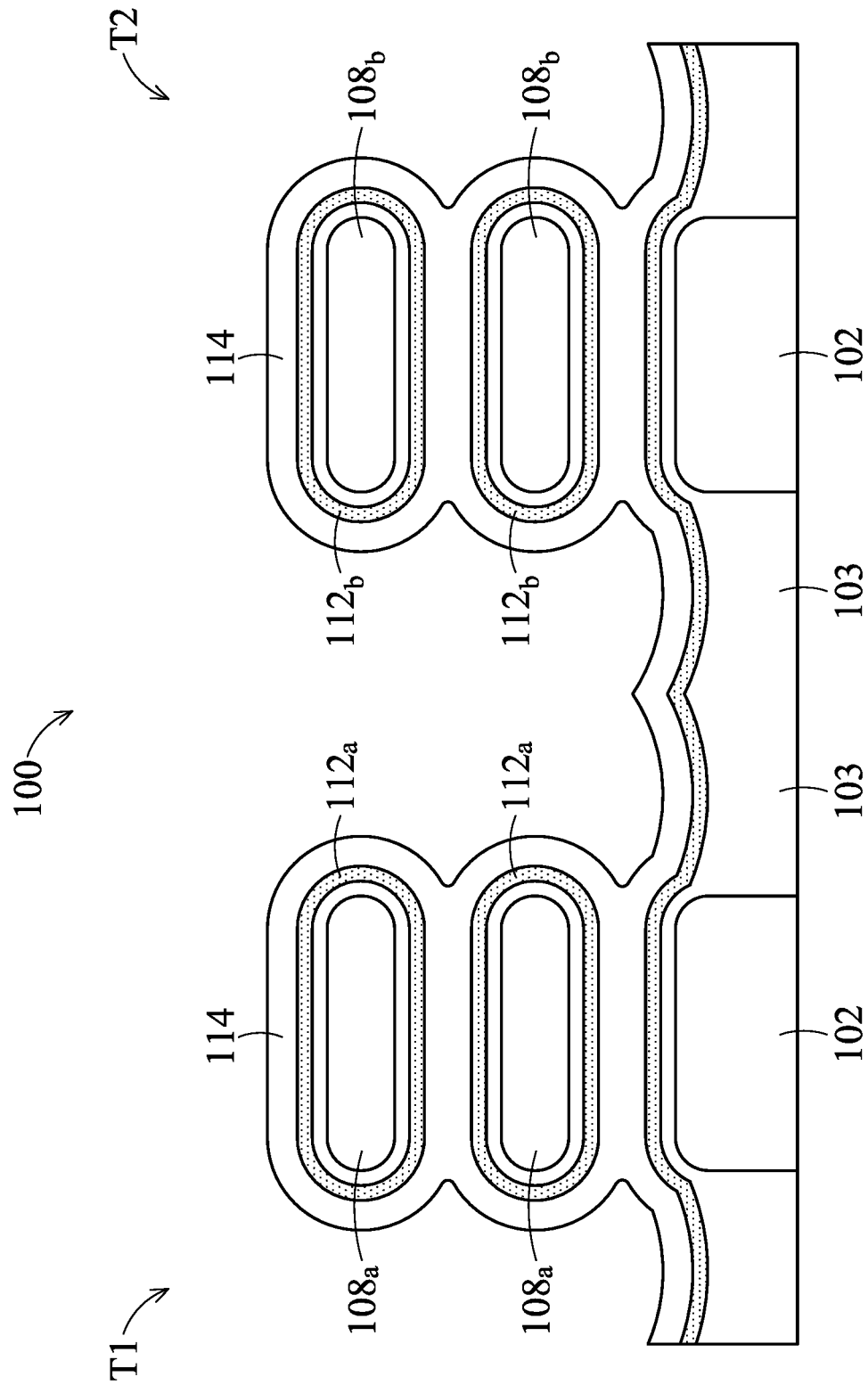

In FIG. 1B, a hard mask layer 114 has been deposited on the high K dielectric layer 112a/112b of both the transistor T1 and the transistor T2. The hard mask layer 114 can include one or more of SiOx (where x represents the concentration of oxygen), AlOx, $ZrO_2$, SiN, TiN, TiOx, ZrOx, AlN, TiSiN, or other suitable materials. The hard mask layer 114 can have a thickness between 1 nm and 5 nm. Although FIG. 1B illustrates the hard mask layer 114 complete filling the gaps between the channel regions 108a/108b of the transistors T1 and T2, in practice, the thickness of the hard mask layer 114 may be selected to ensure that gaps remain between the channel regions 108a/108b of the transistors T1 and T2. This can help ensure that the hard mask layer 114 can be reliably removed from between the channel regions 108a/108b at the appropriate time. The hard mask layer 114 can be deposited by a PVD process, an ALD process, a CVD process, or other suitable deposition processes. The hard mask layer 114 can have other thicknesses, materials, and deposition processes without departing from the scope of the present disclosure.

Figure 1C:
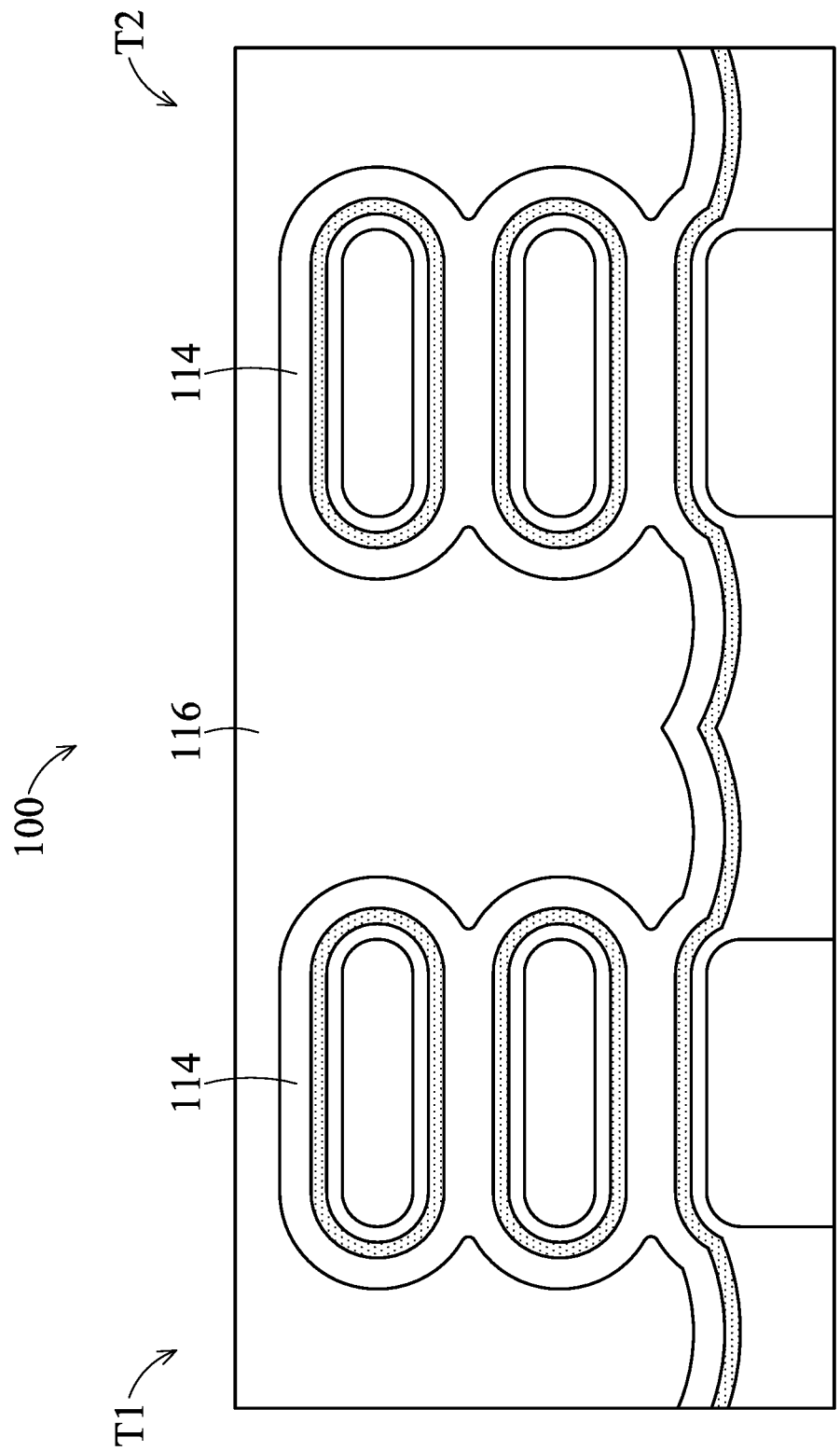

In FIG. 1C a layer of photoresist 116 has been deposited. The layer of photoresist 116 is deposited on the hard mask layer 114. The layer of photoresist 116 can include multiple layers of photoresist including a bottom layer and the top layer. The layer of photoresist 116 can be deposited by standard photoresist deposition techniques including vapor deposition, spread deposition, spin-on coating, or by other suitable process.

Figure 1D:
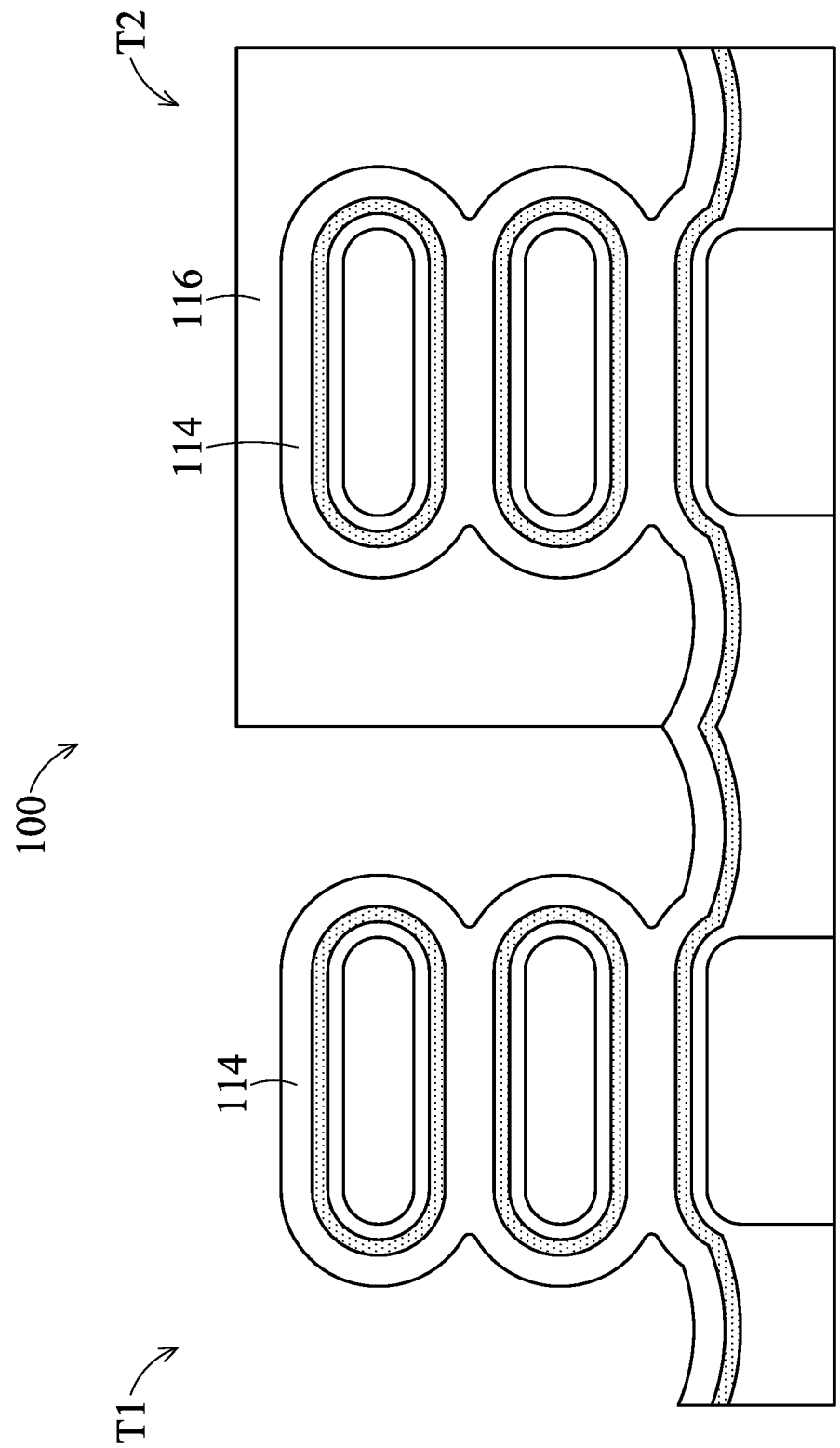

In FIG. 1D, the layer of photoresist 116 has been patterned. The layer of photoresist 116 is patterned to expose the hard mask layer 114 of the transistor T1. The hard mask layer 114 of the transistor T2 is covered by the layer of photoresist 116. The layer of photoresist 116 can be patterned by exposing the layer of photoresist 116 to light via a photolithography mask. Accordingly, the layer of photoresist 116 can be deposited and patterned using standard photolithography techniques. The material of the hard mask 114 is chosen to enable the photoresist to stick to the hard mask 114.

Figure 1E:
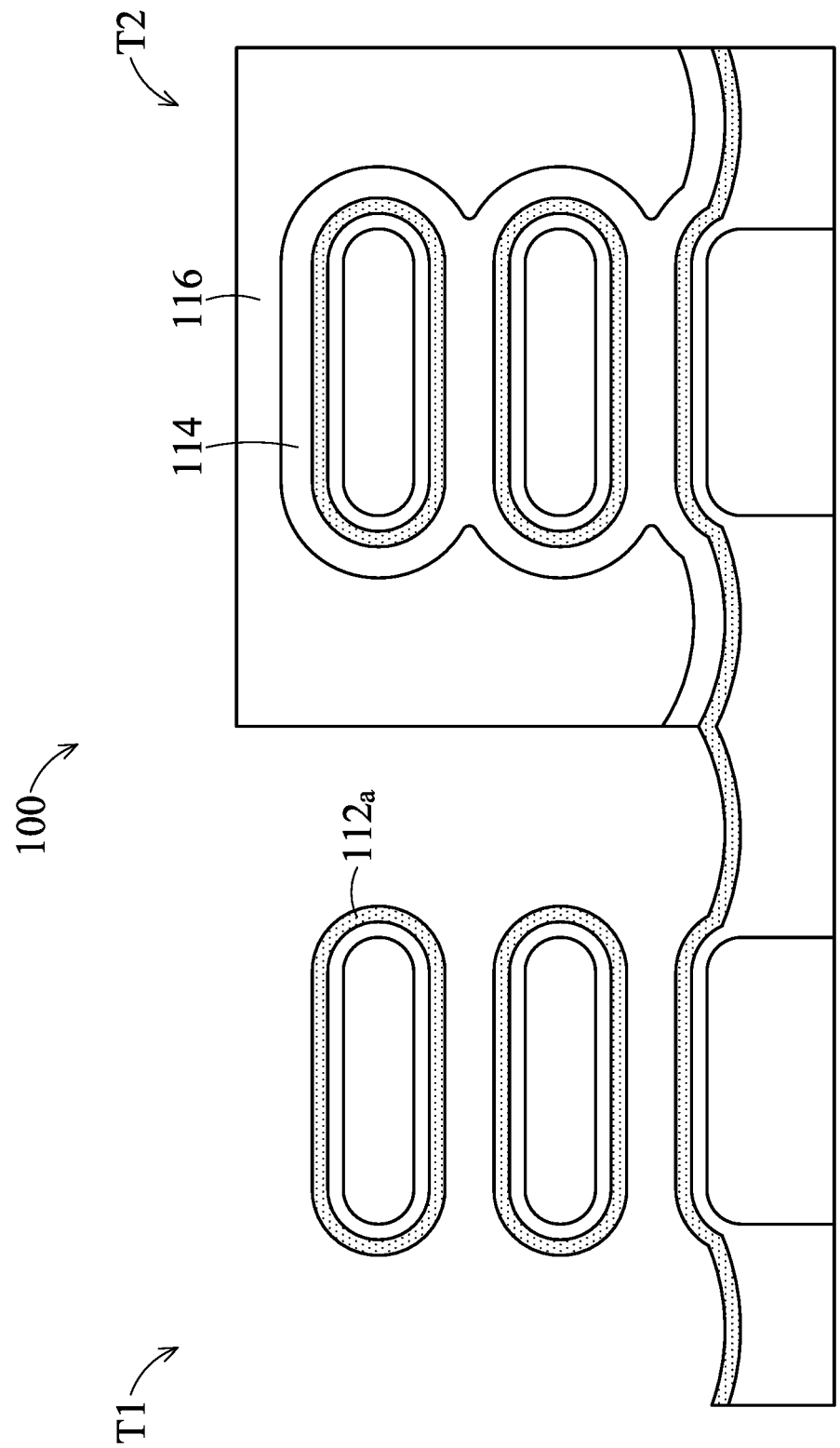

In FIG. 1E, an etching process has been performed on the integrated circuit 100. In particular, the etching process has been performed on the portion of the integrated circuit 100 that is not covered by the layer of photoresist 116. The etching process etches the hard mask layer 114 from the transistor T1. The etching process can be selected to selectively etch the hard mask layer 114 with respect to the high K dielectric layer 112a/112b. This ensures that the hard mask layer 114 will be removed at the location of the transistor T1 without etching or damaging the high K dielectric layer 112a. The etching process can include a wet etch, a dry etch, an atomic layer etching (ALE) process, a timed etch, or other suitable etching techniques. Because the transistor T2 is still covered in the layer of photoresist 116, the etching process does not remove the hard mask layer 114 at the region of the transistor T2.

Figure 1F:
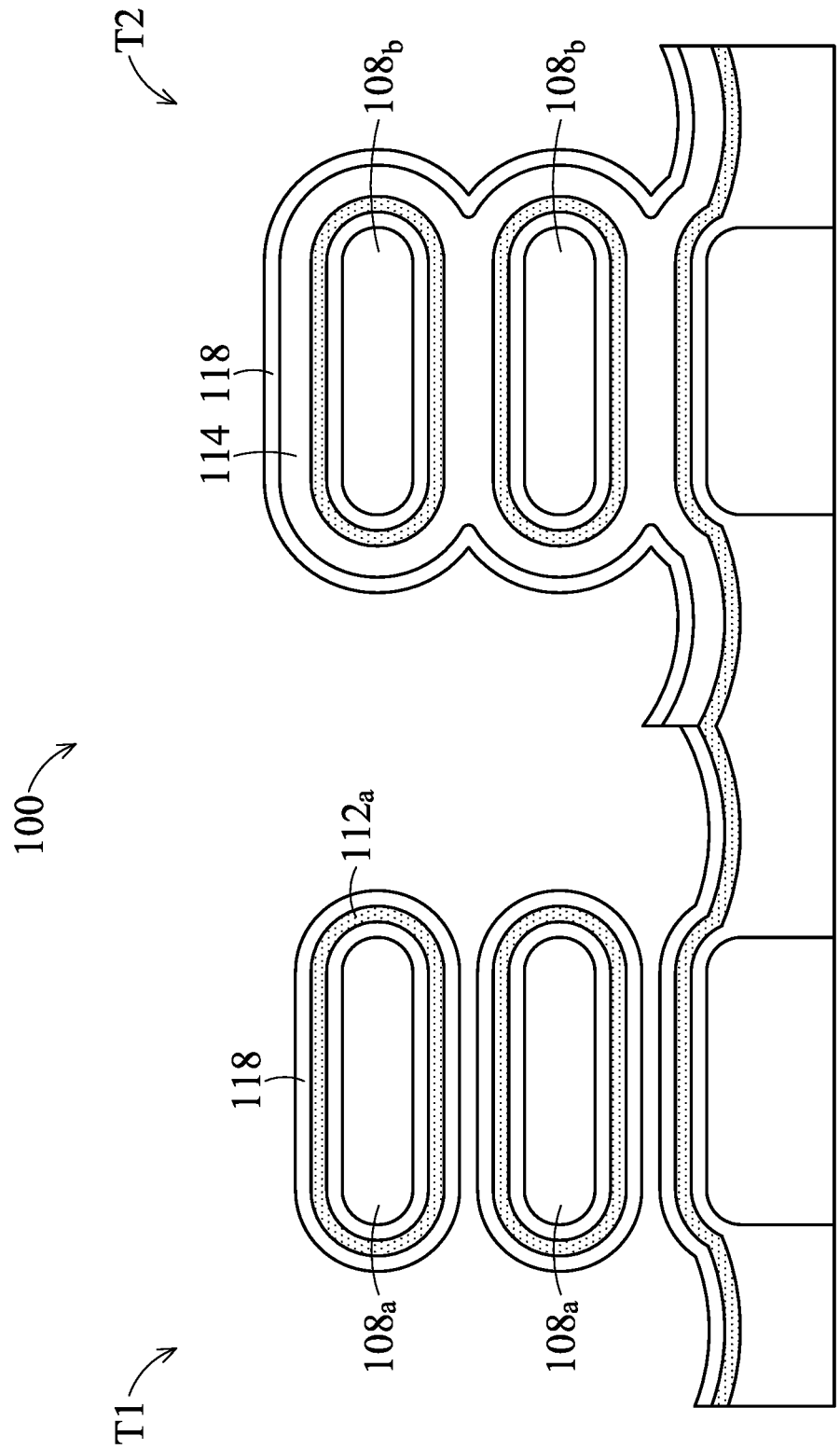

In FIG. 1F, the photoresist layer 116 has been removed. The layer of photoresist 116 can be removed by an ashing process. The ashing process completely removes the layer of photoresist 116. The ashing process may also have an effect on hard mask layer 114 at the transistor T2 and on the high K dielectric layer 112a at the transistor T1. Other suitable methods may be utilized for removing the photoresist without departing from the scope of the present disclosure.

In FIG. 1F, a dipole inducing layer 118 has been deposited at the areas of both the transistor T1 and the transistor T2. The dipole inducing layer 118 is deposited directly on the high K dielectric layer 112a at the transistor T1. The dipole inducing layer 118 is deposited directly on the hard mask layer 114 of the transistor T2. Although FIG. 1F indicates that the dipole inducing layer 118 is not present between the channel regions 108b of the transistor T2, as described previously in some embodiments the hard mask layer 114 does not fill the entirety of the space between the channel regions 108b. In these embodiments, the dipole inducing layer 118 will be positioned on the hard mask layer 114 between the channel regions 108b of the transistor T2.

The dipole-inducing layer 118 can include one or more of La, Y, Al, Sr, Er, Sc, Ti, or Nb. The material of the dipole inducing layer 118 can be selected for a high etch selectivity with respect to the high K dielectric layer 112a/112b. So that during removal of the dipole inducing layer 118, little or no of the high K dielectric layer 112a/112b will be removed. The dipole-inducing layer 118 can have a thickness between 0.5 nm and 1.5 nm. It may be beneficial for the dipole-inducing layer to be less than 1.5 nm so that total thickness of the gate dielectric can remain low. The dipole-inducing layer 118 can be deposited by a physical vapor deposition (PVD) process, an ALD process, a CVD process, or other suitable deposition processes. The dipole-inducing layer 118 can utilize other thicknesses, materials, and deposition processes without departing from the scope of the present disclosure.

One purpose of the dipole-inducing layer 118 is to adjust the threshold voltage of the transistor T1 with respect to the threshold voltage of the transistor T2. The dipole-inducing layer 118 will be utilized to generate a dipole layer on the interfacial dielectric layer 110a/110b of the transistor T1. The dipole layer that will be generated from the dipole-inducing layer 118 has a dipole effect that augments or reduces the effect of the voltage applied to a gate electrode in turning on or turning off the transistor T1. The dipole dopants in the dipole-inducing layer 118 are driven into an adjacent dielectric layer to modulate the effective work function of the transistor, thereby increasing or decreasing the threshold voltage of the transistor T1. In some embodiments, the materials of the dipole-inducing layer 118, the high K dielectric layer 112a/112b, and the interfacial dielectric layer 110a/110b are selected to result in a dipole layer that reduces the threshold voltage of the transistor T1. As will be set forth in more detail below, the process of producing the dipole layer from the dipole-inducing layer 118 results in substantially no dipole layer on the interfacial dialectric layer 110b of the transistor T2.

Figure 1G:
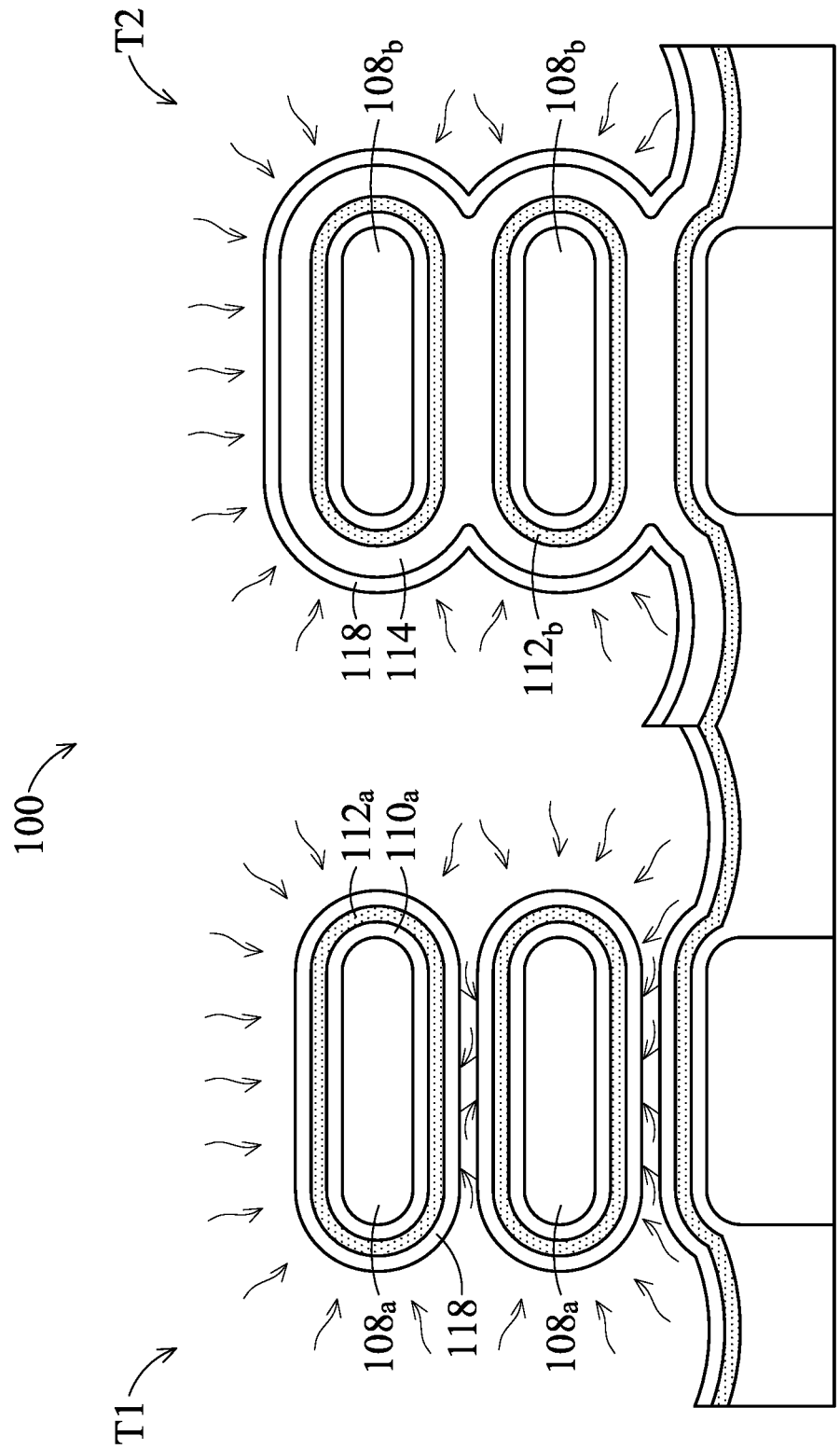

In FIG. 1G a thermal annealing process is performed on the integrated circuit 100. The thermal annealing process can include subjecting the integrated circuit 100 to elevated temperatures for a selected duration of time. For example, the thermal annealing process can include subjecting the integrated circuit to temperatures between 400° C. and 1000° C. The duration of the thermal annealing process can be between 0.5 seconds and 30 seconds. Other durations and temperatures can be utilized without departing from the scope of the present disclosure.

The thermal annealing process causes atoms from the dipole-inducing layer to bond with at least one of the interfacial dielectric layer 110a and the high-K dielectric layer 112a in a way that generates a dipole layer. The dipole layer can result from polarizing at least one of the dipole-inducing layer 118, the interfacial dielectric layer 110a, and the high-K dielectric layer 112a. The dipole layer can be a dipole oxide, in the example in which the interfacial dielectric layer 110a is silicon dioxide. The dipole oxide consists of an oxide of the material of the dipole-inducing layer 118. The dipole oxide can include oxides of Y, La, Al, Sr, Er, Sc, Nb, or other materials depending on the material of the dipole-inducing layer 118.

The presence of the dipole layer in the transistor T1 leads to the difference in threshold voltages between the transistor T1 and the transistor T2. The threshold voltage of the transistor T1 may be lower than the threshold voltage of the transistor T2 by up to 300 mV, though other threshold voltage changes are possible without departing from the scope of the present disclosure. In other embodiments, the threshold voltage of the transistor T1 may be higher than the threshold voltage of the transistor T2.

Because the hard mask layer 114 is present at the transistor T2, and in particular, between the dipole inducing layer 118 and the high K dielectric layer 112b, dipoles are not driven into the high K dielectric layer 112b at the transistor T2. Instead, dipoles are driven into the hard mask layer 114. Accordingly, the high K dielectric layer 112b and the interfacial dielectric layer 110b of the transistor T2 do not receive dipoles. The result is that the threshold voltage of the transistor T2 is not changed.

Figure 1H:
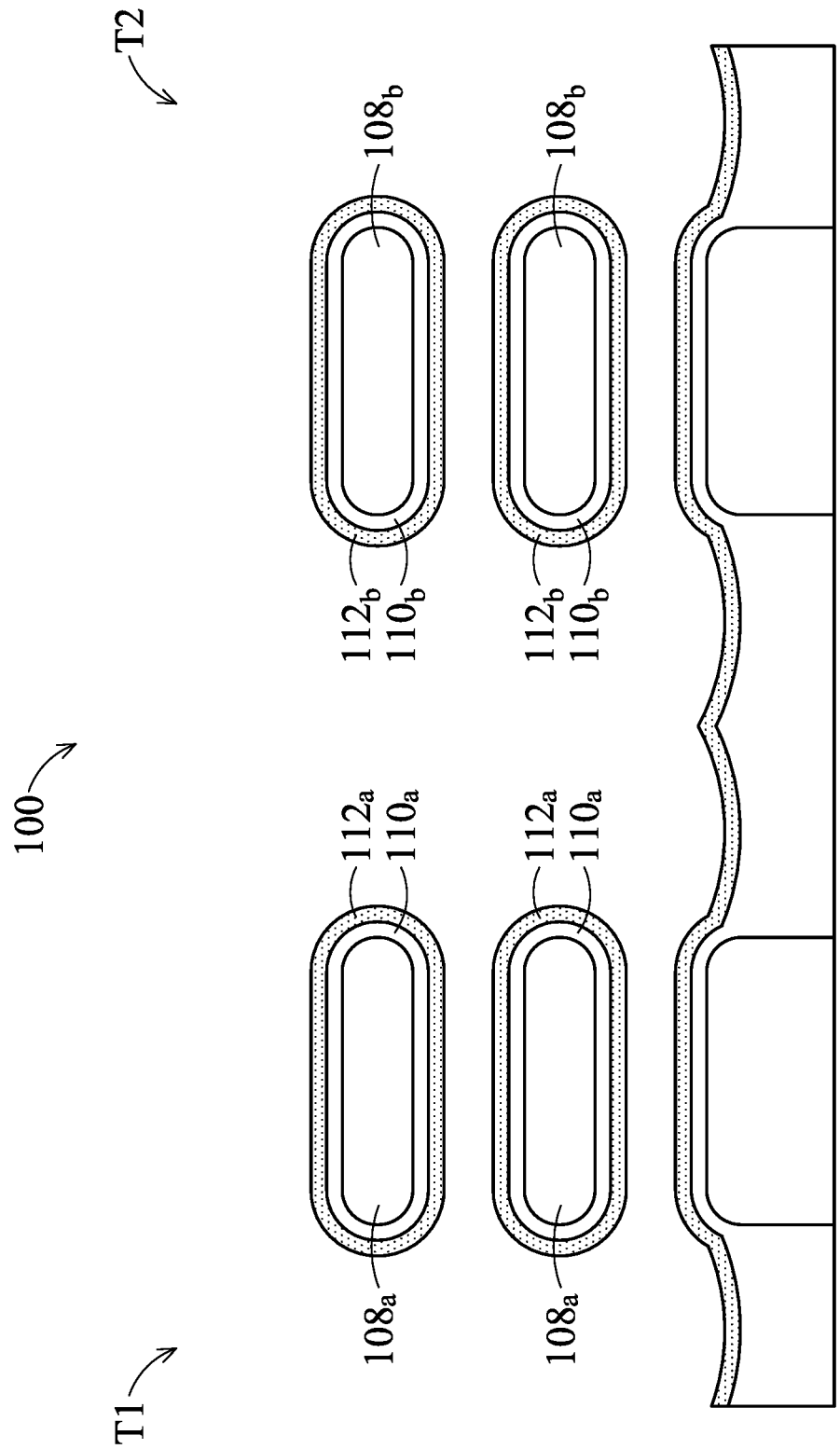

In FIG. 1H, an etching process has been performed on the integrated circuit 100. The etching process etches the dipole-inducing layer 118 from the transistors T1 and T2. In particular, the etching process removes the dipole inducing layer 118 from the hard mask layer 114 of the transistor T2. The etching process removes the dipole inducing layer 118 from the high K dielectric layer 112a of the transistor T1. The etching process also removes the hard mask layer 114 from the transistor T2. The result is that the high K dielectric layer 112a/112b of both the transistor T1 and T2 is exposed. The etching process can include an isotropic etching process that etches the hard mask layer 114 and the dipole-inducing layer 118 equally in all directions. The duration of the etching process is selected to entirely remove the hard mask layer 114 and dipole-inducing layer 118 from the channel regions 108b of the transistor T2. The etching process can include a wet etch, a dry etch, an ALE process, a timed etch, or other suitable etching processes. The etching process can include multiple etching steps. For example, a first etching step can be performed to remove the dipole inducing layer 118. A second etching step can be performed to remove the hard mask layer 114. Other types of etching processes can be utilized without departing from the scope of the present disclosure.

As will be set forth in more detail below, the reversed tone patterning process described in relation to FIGS. 1A-1H can be utilized to provide more than two different threshold voltages by repeating the process described in relation to FIGS. 1A-1H. For example, if four different threshold voltage transistors are desired, for transistors, then the process of FIGS. 1A-1H is performed to drive dipoles into transistors 1 and 2, while transistors 3 and 4 are protected by hard mask layer 114. This changes the threshold voltage of transistors 1 and 2 by a first amount. The hard mask layer and the dipole inducing layer are removed from all of the transistors. The process is then performed again with dipole inducing materials or parameters to drive dipoles into transistors 1 and 3 while transistors 2 and 4 are protected by the hard mask layer 114. This changes the threshold voltages of the transistors 1 and 3 by a second amount different than the first amount. The result is that all four transistors now have different threshold voltages by using the reversed tone patterning process two times. As will be set forth in more detail below, more than four different threshold voltages can be obtained.

The process described in relation to FIGS. 1A-1H has provide several benefits compared to alternative processes that can be used to form a dipole layer at the transistor T1. In particular, the process described in relation to FIGS. 1A-1H utilizes a reversed tone patterning process for forming dipoles in the transistor T1. One alternative process is a positive tone patterning process. In the positive tone patterning process, the dipole inducing layer is first deposited directly on the high K dielectric layer 112a/112b of both the transistor T1 and the transistor T2. The hard mask layer is then deposited, followed by the photoresist. The photoresist is patterned to expose the hard mask at the transistor T2. The hard mask and the dipole inducing layer are then removed from the transistor T2, while the dipole inducing layer and the hard mask layer at the transistor T1 are protected by the photoresist. The photoresist on the hard mask layer is then removed from the transistor T1 with an ashing process and the etching process. This leaves the dipole inducing layer exposed at the transistor T1. The drive in process is then performed. Because the dipole inducing layer is present only at the transistor T1, dipoles are formed only at the transistor T1, thereby changing the threshold voltage of the transistor T1.

However, the positive tone patterning process may cause several problems. For example, the positive tone patterning results in damage to the high K dielectric layer at the transistor T2 during the etching process and the ashing process. For example, in positive tone patterning process the dipole inducing layer may first be deposited on a high-K gate dielectric layer. A hard mask layer may then be deposited on the dipole including layer. A layer of photoresist may then be deposited on the hard mask. The layer of photo resist may then be patterned via a photolithography process. An etching process then removes the hard mask and the dipole inducing layer in accordance with the patterning of the photoresist layer. An ashing process may then be performed to remove the remaining photoresist. This etching process and the ashing process can damage and reduce the thickness of the high K dielectric layer at the transistor T1. The damage can include loss of thickness, increased roughness, oxygen vacancy generation, and other potential issues. These can result in equivalent oxide thickness change and variation that negatively impacts the threshold voltage. This damage to and loss of thickness of the high K dielectric layer results in an undesired change in the threshold voltage of the transistor T1. If more than two different threshold voltages are desired and the positive tone patterning process is used twice, then the damage to the high K dielectric layers is even greater and the transistors that were intended to not have a change in threshold voltage have even greater changes in threshold voltage.

The reversed tone patterning process described in relation to FIGS. 1A-1H avoids the drawbacks of the positive tone patterning process. In particular, little or no damage is done to the high K dielectric layer of the transistor T2 for which a change in threshold voltage is not desired. This is because the etching processes are mainly performed at the regions for which a change in threshold voltages desired. In the example of P-type transistors with N-dipoles, a very low threshold voltage may be specified for high performance devices. For such P-type transistors, it may be very desirable to have a set of transistors for which no change in threshold voltage takes place. The reversed tone process is able to provide such ultralow threshold voltage P-type transistors in which high K dielectric layers with good quality of thickness are utilized to provide a high P-type work function that is close to the bandgap voltage. Degradation of the high K dielectric layer can lower the P-type work function, thus increasing the threshold voltage. Similar benefits can be provided for N-type transistors with P-dipoles. The processes described herein may be utilized for both P-type transistors and N-type transistors having P-dipoles or N-dipoles.

In some embodiments, the reversed tone patterning process can be combined with a positive tone patterning process. This is utilized in instances for which more than two different threshold voltages are desired. In some cases it may be acceptable to suffer the damage of a single P tone process. In these cases, a reversed tone process may be utilized for a first dipole drive-in process. A positive tone patterning process may then the utilized for a second dipole drive-in process. Further details regarding the combination of reversed tone and positive tone patterning processes will be provided below.

Figure 1I:
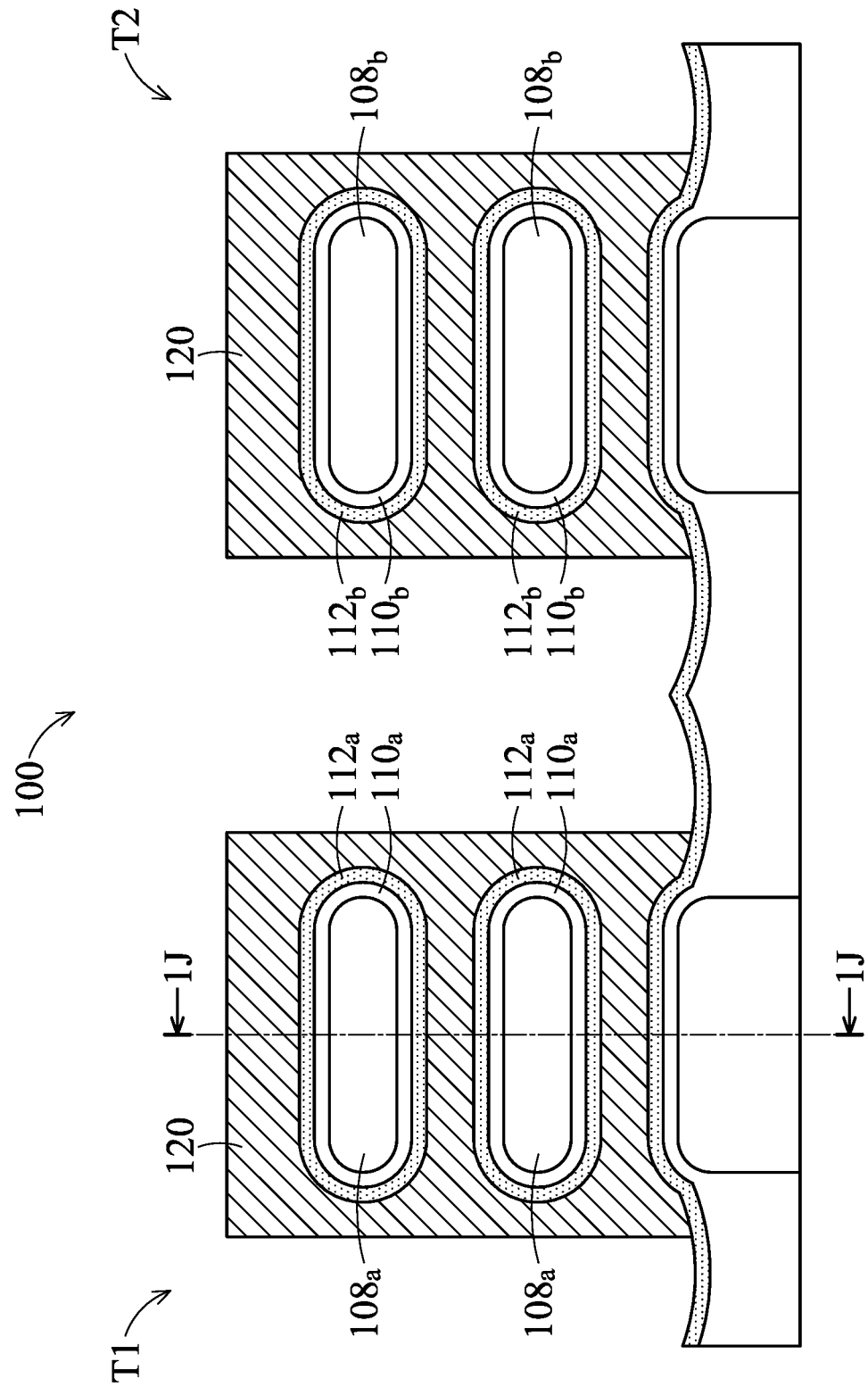

In FIG. 1I, a gate metal 120 has been deposited surrounding the channel regions 108a/108b of the transistor T1 and the transistor T2. The gate metal 120 is separated from the channel regions 108a/108b by the interfacial dielectric layer 110a/110b and the high-K dielectric layer 112a/112b. In the view of FIG. 1I, the gate metal 120 is illustrated as a single gate metal. However, in practice, the gate metal 120 may include multiple separate metal layers. For example, the gate metal 120 may include relatively thin glue layers, barrier layers, or work function layers initially deposited on the high-K dielectric layer 112a/112b. These initial gate metal layers can include one or more of titanium nitride, tantalum nitride, tungsten nitride, tantalum, or other materials. After deposition of the initial gate metal layers, a gate fill material may be deposited. The gate fill material can include tungsten, titanium, tantalum, cobalt, aluminum, or copper. The initial gate metal layers and the gate fill material collectively make up the gate metal 120. The various layers of the gate metal 120 can be deposited with one or more deposition processes including PVD, CVD, ALD, or other suitable deposition processes. Other materials, types of layers, and deposition processes can be utilized for the gate metal 120 without departing from the scope of the present disclosure.

Figure 1J:
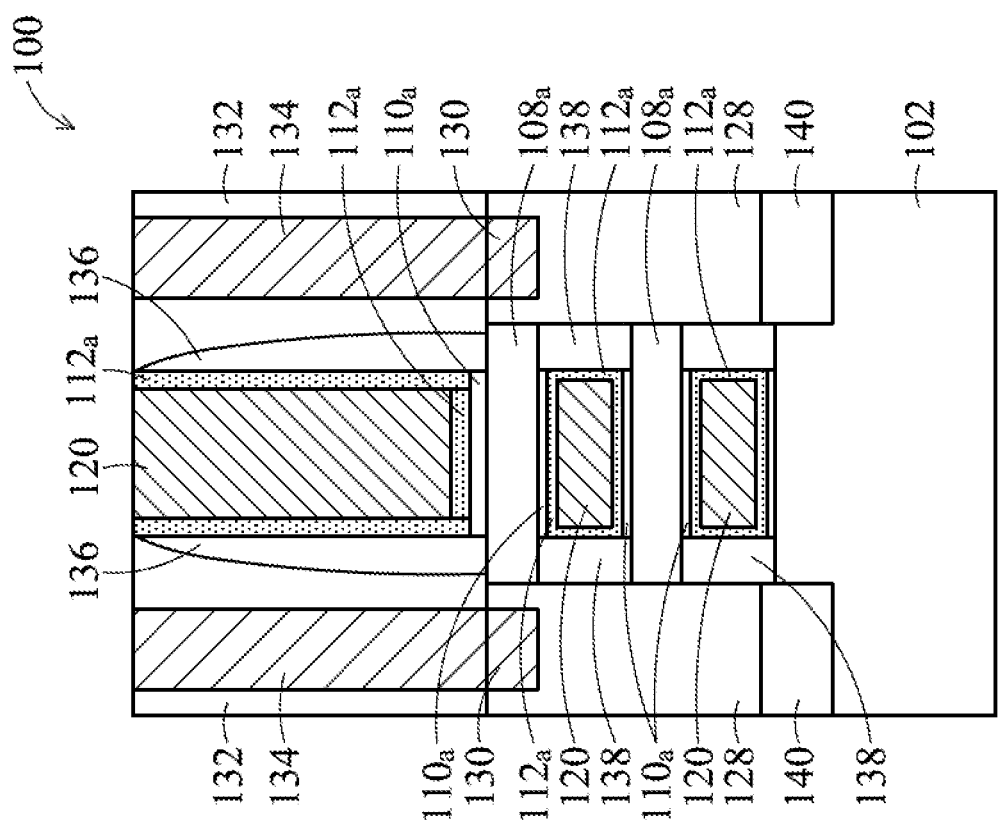

FIG. 1J is a cross-sectional view of the integrated circuit 100, according to one embodiment. The view of FIG. 1J is taken along cross-section lines 1J of FIG. 1I. The view of FIG. 1J illustrates more fully the overall structure of the transistor T1. The structure of the transistor T2 will be substantially similar to the structure of the transistor T1.

FIG. 1J illustrates dielectric barriers 140 between the semiconductor substrate 102 and the source/drain regions 128. The dielectric barriers 140 can be utilized to electrically isolate the source/drain regions 128 from the semiconductor substrate. The dielectric material for the dielectric barriers 140 may include silicon oxide, silicon nitride, silicon oxynitride (Sian SiOCN, SiCN, fluorine-doped silicate glass (FSG), or a dielectric material, formed by low pressure CVD (LPCVD), plasma-CVT or flowable CVD. Other materials and structures can be utilized for the dielectric barriers 140 without departing from the scope of the present disclosure.

The integrated circuit 100 includes source/drain regions 128. The source/drain regions 128 includes semiconductor material. The source/drain regions 128 can be grown epitaxially from the channel regions 108a. The source/drain regions 128 can be epitaxially grown from the channel regions 108a or from the substrate 102 prior to formation of the channel regions 108a. The source/drain regions 128 can be doped with N-type dopants species in the case of N-type transistors. The source/drain regions 128 can be doped with P-type dopant species in the case of P-type transistors.

The channel regions 108a extend between the source/drain regions 128. As described previously, the channel regions 108a correspond to the channel regions of the transistor T1. By applying selected voltages to the gate metal 120 and the source/drain regions 128, current flows through the channel regions 108a between the source/drain regions 128.

FIG. 1J also illustrates inner spacers 138 positioned between the source/drain regions 128 and the gate metal 120. More particularly, the inner spacers 138 are positioned between the high-K dielectric layer 112a and the source/drain regions 128. The inner spacers 138 can include one or more dielectric materials including silicon nitride, SiON, SiOCN, SiCN, silicon oxide, or other dielectric materials. Other dielectric materials can be utilized for the inner spacers 138 without departing from the scope of the present disclosure.

The view of FIG. 1J illustrates the interfacial dielectric layer 110a in contact with the channel regions 108a. The high-K dielectric layer 112a is in contact with the interfacial dielectric layer 110a. The gate metal 120 is in contact with the high-K dielectric layer 112a.

The integrated circuit 100 includes an interlevel dielectric layer 132 positioned on the source/drain regions 128. The interlevel dielectric layer 132 can include one or more of silicon oxide, silicon nitride, SiCOH, SiOC, or an organic polymer. Other types of dielectric materials can be utilized for the interlevel dielectric layer 132 without departing from the scope of the present disclosure.

The integrated circuit 100 includes silicide regions 130 that have been formed in the source/drain regions 128. The silicide regions 130 can include titanium silicide, cobalt silicide, or other types of silicide. Contact plugs 134 have been formed in the interlevel dielectric layer 132. The contact plugs 134 can include cobalt or another suitable conductive material. The contact plugs 134 can be utilized to apply voltages to the source/drain regions 128 of the transistor T1. The contact plugs 134 can be surrounded by a titanium nitride glue layer.

The gate metal 120 has been deposited in a trench formed in the interlevel dielectric layer 132. The gate metal 120 also surrounds the channel regions 108a as shown in FIG. 1I. Sidewall spacers 136 are positioned around the gate metal 120 in the trench in the interlevel dielectric layer 132. The sidewall spacers 136 can include multiple dielectric layers including one or more of silicon nitride, silicon oxide, silicon carbide, or other suitable dielectric materials. The high-K dielectric layer 112a is also positioned on the sidewalls of the trench between the sidewall spacers 136 and the gate metal 120. Other materials, structures, and features can be included in the gate all around transistor T1, and correspondingly, the gate all around transistor T2 without departing from the scope of the present disclosure.

In some embodiments, the process for forming the gate all around transistors T1 and T2 of FIGS. 1A-1J can include forming an alternating stack of first and second epitaxial semiconductor layers over the substrate 102. The process can include patterning the semiconductor stack to form fins and forming a shallow trench isolation regions around the fins. Dummy gate structures, including polysilicon material, can then be formed across the fins. Sidewall spacers 136 can then be formed on sidewalls of the dummy gate. The fins can be patterned to form recesses for source/drain regions 128. The first epitaxial layers can then be recessed deformed notches in which the inner spacers 138 are formed. Source/drain regions 128 are then formed. An interlevel dielectric layer 132 can then be formed. The dummy gate structure and the first epitaxial layers are then removed to define channel regions 108a from the second epitaxial layers. The interfacial dielectric layer 110a and the high K dielectric layer 112a are then deposited on the channel regions 108a. The reversed tone patterning processes can then be performed to generate multiple threshold voltages. The gate metal 120 can then be deposited surrounding the channel regions 108a. Various other processes can be utilized to form gate all around transistors without departing from the scope of the present disclosure.

Figure 2:
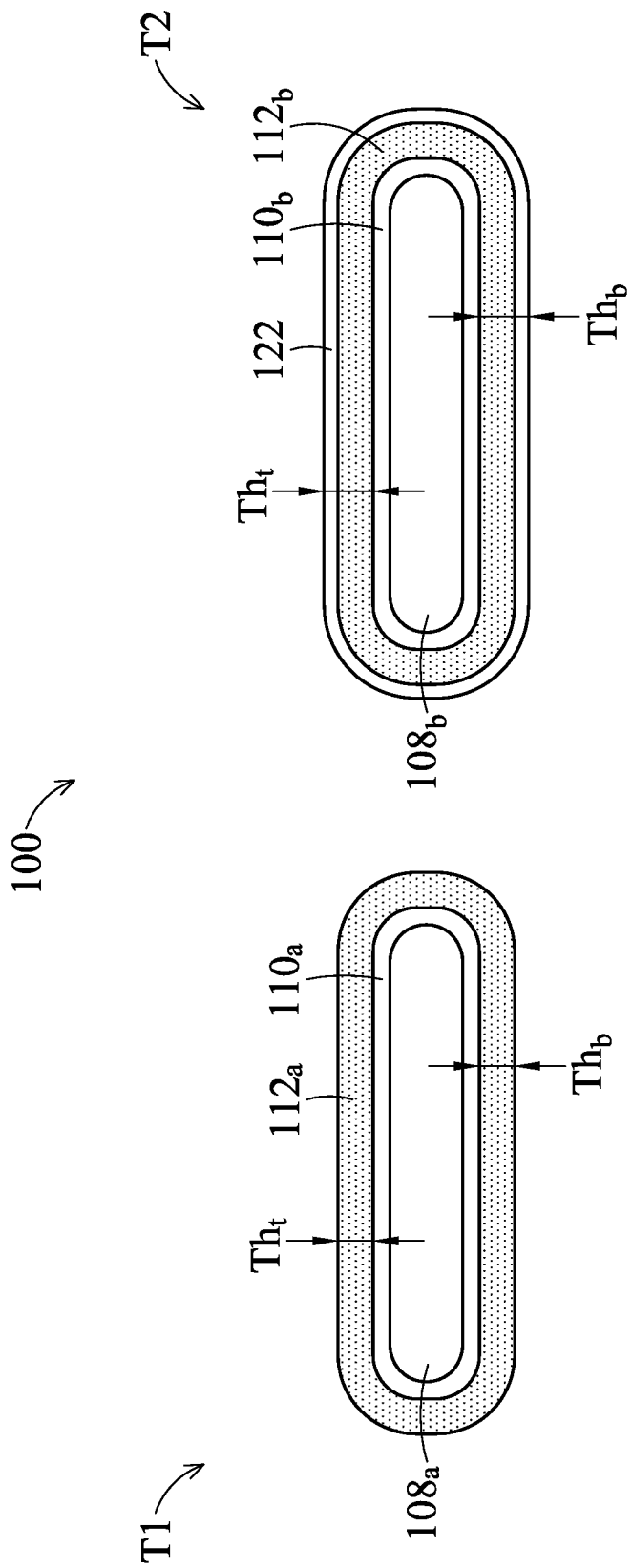
FIG. 2 is a cross-sectional view of an integrated circuit, in accordance with some embodiments.

FIG. 2 is a cross-sectional view of portions of the first transistor T1 and the second transistor T2, in accordance with some embodiments. In particular, FIG. 2 illustrates one channel region 108a of the transistor T1 and one channel region 108b of the transistor T2. In some embodiments, the process described in relation to FIGS. 1A-1H may result in a particular characteristics of the channel regions 108a for the transistors T1 for which dipole driving was performed and for the transistors T2 for which dipole driving was not performed. For example, for the transistor T1, there may be a difference in thickness Tht of the high K dielectric layer 112a on the top of the channel region 108a compared to the thickness Thb of the high K dielectric layer 112a on the bottom of the channel region 108a. In particular, the thickness Tht of the transistor T1 is less than the thickness Thb of the transistor T1. In some embodiments, this difference in thickness between top and bottom may occur only in the highest channel region 108a of the transistor T1. Accordingly, in some embodiments, the top channel region 108a of the transistor T1 has a difference in thickness of the high K dielectric layer on the top side and the bottom side, whereas lower channel regions 108a of the transistor T1 do not have a difference in thickness of the high K dielectric layer 112a between the top and bottom.

In some embodiments, for the transistor T2 there is no difference between Tht and Thb for any of the channel regions 108b due to the presence of the hard mask layer 114 between the high K dielectric layer 112b and the dipole inducing layer 118. Furthermore, the thicknesses Tht and Thb for all of the channel regions 108b of the transistor T2 may be greater than Tht and Thb for all of the channel regions 108a of the transistor T1. The difference in thickness between the high-K dielectric layer 112b of the transistor T2 and the high-K dielectric layer 112a of the transistor T1 may be between 0.5 Å and 5 Å.

In some embodiments, there may be some intermixing of the hard mask layer 114 and the high K dielectric layer 112b at the channel regions 108b of the transistor T2. This may result from the presence of the hard mask layer 114 on the high K dielectric layer 112b during the thermal annealing process that drives the dipoles. This thermal annealing process may cause a thin mixing layer 122 on the surface of the high K dielectric layer 112b of the transistor T2. The mixing layer will include traces of both the material of the high K dielectric layer 112b and the material of the hard mask layer 114. After the gate metal 120 is deposited, the mixing layer 122 may still be present between the high K dielectric layer 112b and the gate metal 120 at the transistor T2. The thickness of the mixing layer may be between 0.5 Å and 10 Å. Alternatively, the intermixing layer may be partially or fully removed before forming the gate metal 120.

As described previously, if only positive tone patterning processes are utilized, then the transistors for which no change in threshold voltages desired will have a significantly reduced thickness of the high K dielectric layer. In some embodiments, this does not occur for reversed tone patterning processes.

Figure 3A:
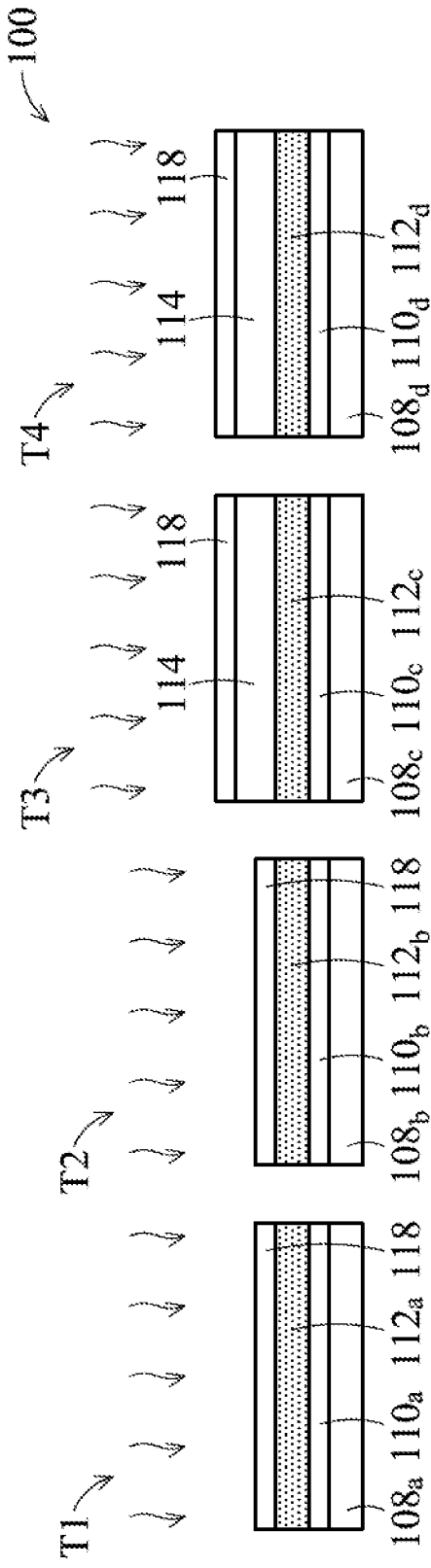
FIGS. 3A and 3B are cross-sectional views of an integrated circuit, in accordance with some embodiments.
Figure 3B:
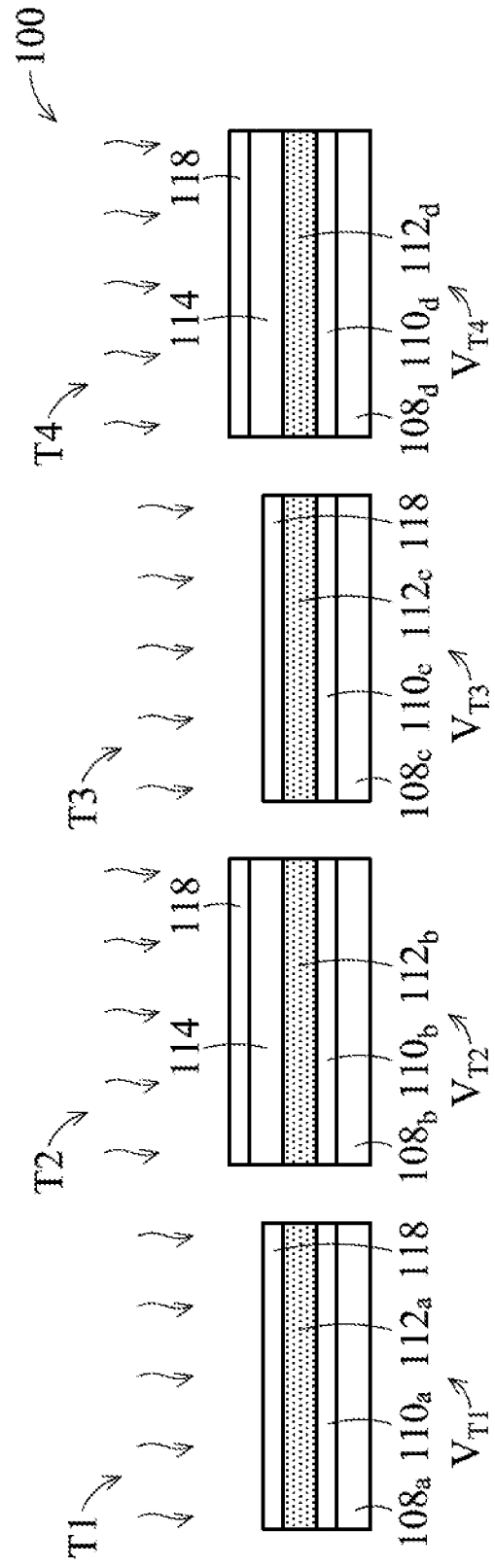

FIGS. 3A and 3B are cross-sectional views of an integrated circuit 100 at an intermediate stage of processing, in accordance with some embodiments. FIGS. 3A and 3B illustrate a process for forming four transistors each with a different threshold voltage. FIGS. 3A and 3B utilize the reversed tone patterning principles illustrated in relation to FIGS. 1A-1I.

FIG. 3A illustrates an integrated circuit 100 including four transistors T1-T4. In practice, the integrated circuit 100 will include multiple transistors T1, multiple transistors T2, multiple transistors T3, and the multiple transistors T4. One of each type of transistor is illustrated in FIG. 3A. The cross-sectional view of FIG. 3A is simplified in that only a portion of the channel region 108a-d of each transistor is shown. The interfacial dielectric layer 110a-d is positioned on the channel regions 108a-d. The high K dielectric layer 112a-d is positioned on the interfacial dielectric layer 110a-d. Furthermore, while embodiments herein describe transistors including semiconductor nanostructures, in practice, principles of the present disclosure extend to other types of transistors.

FIG. 3A illustrates a stage of processing corresponding to FIG. 1G. In particular, a reversed tone patterning process has been performed such that the dipole inducing layer 118 is positioned on the high K dielectric layer 112a/112b at the transistors T1 and T2. The hard mask layer 114 is positioned on the high K dielectric layer 112c/112d at the transistors T3 and T4. The dipole inducing layer 118 is positioned on the hard mask layer 114 at the transistors T3 and T4. A thermal annealing process is performed as described in relation to FIG. 1G to drive the dipoles into the high K dielectric layer 112a/112b and the interfacial dielectric layer 110a/110b at the transistors T1 and T2. Meanwhile, the hard mask layer 114 protects the high K dielectric layer 112c/112d from receiving dipoles at the transistors T3 and T4. Thus, in FIG. 3A, the transistors T1 and T2 receive a first dipole drive-in process while the transistors T3 and T4 remain unchanged. After the thermal annealing process, the dipole inducing layer 118 is removed from all of the transistors and the hard mask layer 114 is removed from the transistors T3 and T4.

FIG. 3B, the processing steps of FIGS. 1A-1H have been performed again except that photolithography mask is patterned such that the transistors T2 and T4 remain covered in the hard mask layer 114. The dipole inducing layer 118 is deposited directly on the high K dielectric layer 112a/112c at the transistors T1 and T3. The dipole inducing layer 118 is deposited on the hard mask layer 114 of the transistors T2 and T4. A thermal annealing process is performed to drive the dipoles into the high K dielectric layer 112a/112c and the interfacial dielectric layer 110a/110c at the transistors T1 and T3. The high K dielectric layer 112b/112d of the transistors T2 and T4 are protected from the dipole drive-in process by the presence of the hard mask layer 114. The hard mask layer and the dipole inducing layer 118 can then be removed and the gate metal 120 can be deposited on all of the transistors T1-T4.

The result of the processes described in relation to FIGS. 3A and 3B is that each transistor T1-T4 has a different threshold voltage. It should be noted that the first dipole drive-in process (FIG. 3A) results in a first change in threshold voltage for those transistors that receive it. The second dipole drive-in process (FIG. 3B) results in a second change in threshold voltage for the transistors that receive it. The first and second changes in threshold voltage are different from each other. The difference can be based on utilizing a different material from the dipole inducing layer 118 in FIG. 3B than in FIG. 3A, a different length or temperature of the thermal annealing process, or even different thicknesses of the dipole inducing layer 118. The result is that the transistor T1 receives both the first and second dipole drive-in processes and has a threshold voltage Vt1. The second transistor T2 receives only the first dipole drive-in process and has a threshold voltage Vt2. The transistor T3 receives only the second dipole drive-in process and has a threshold voltage Vt3.

The transistor T4 does not receive either dipole drive-in process and has a threshold voltage Vt4. Because the transistor T4 was protected by the hard mask layer 114 during each of the dipole drive-in processes, the transistor T4 may receive less damage to the high K dielectric layer 112d. This may enable the transistor T4 to be used as a high-performance device.

Figure 4:
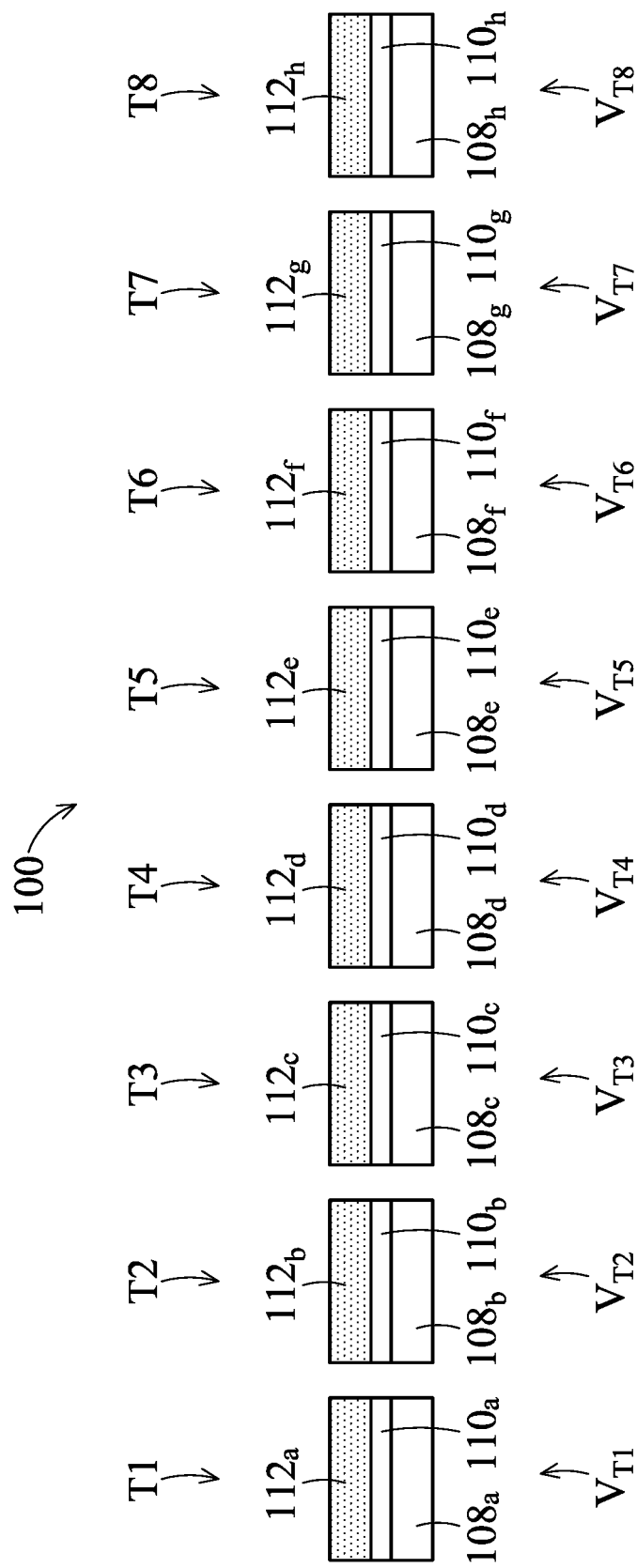
FIG. 4 is a cross-sectional view of an integrated circuit, in accordance with some embodiments.

FIG. 4 is a cross-sectional view of an integrated circuit 100, in accordance with some embodiments. FIG. 4 illustrates a portion of a transistors T1-T8. As in FIGS. 3A and 3B, a portion of the channel region 108a-h, the interfacial dielectric layer 110a-h, and the high K dielectric layer 112a-h are illustrated for each transistor T1-T8. In FIG. 4, three dipole drive-in processes have been performed utilizing three reversed tone patterning process. In other words, while FIGS. 3A and 3B illustrates two reversed tone patterning and dipole drive-in processes, in FIG. 4 a third dipole drive-in process has been performed in order to provide different threshold voltages for eight transistors.

Transistors T1-T4 receive the first dipole drive-in process while transistors T5-T8 are protected by the hard mask layer 114. Transistors T1, T2, T5, and T6 receive the second dipole drive-in process while the transistors T3, T4, T7, and T8 are protected by the hard mask layer 114. Transistors T1, T3, T5, and T7 receive the third dipole drive-in process while the transistors T2, T4, T6, and T8 are protected by the hard mask layer 114. Each of the dipole drive-in processes provides a different change in threshold voltage, as described previously. The transistor T1 receives all three dipole drive-in processes and has a threshold voltage Vt1. The transistor T2 receives the first and second dipole drive-in processes and has a threshold voltage Vt2. The transistor T3 receives the first and third dipole drive-in processes and has a threshold voltage Vt3. The transistor T4 receives the first dipole drive-in process and has a threshold voltage Vt4. The transistor T5 receives the second and third dipole drive-in processes and has a threshold voltage Vt5. The transistor T6 receives the second dipole drive-in process and has a threshold voltage Vt6. The transistor T7 receives only the third dipole drive-in process and has a threshold voltage Vt7. The transistor T8 receives none of the dipole drive-in processes and has a threshold voltage Vt8. Each of the transistors T1-T8 has a different threshold voltage than the others.

Figure 5A:
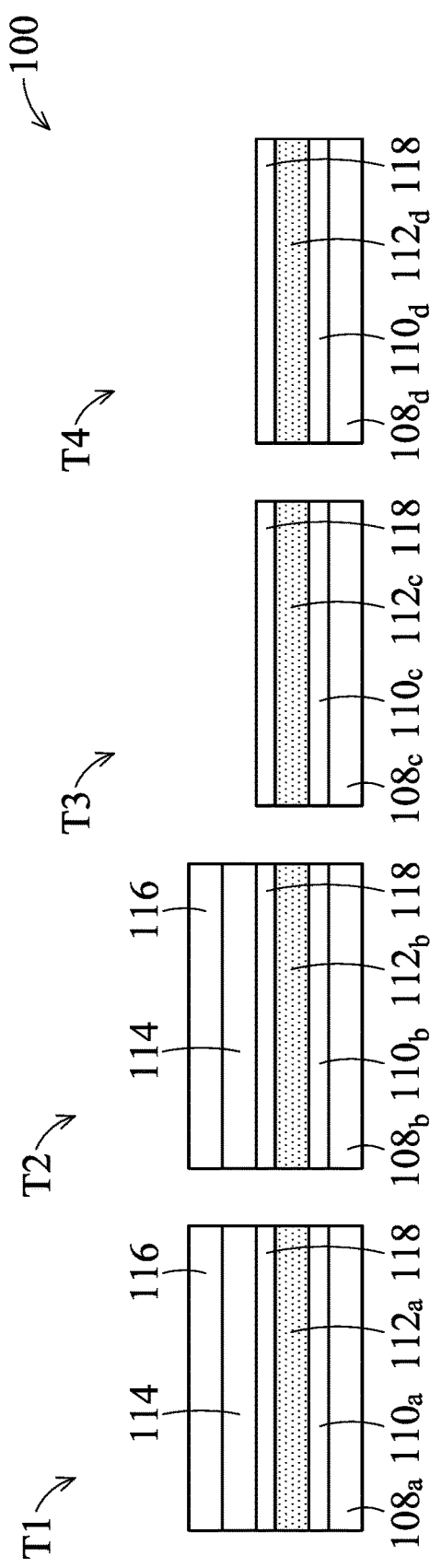
FIGS. 5A-5C are cross-sectional views of an integrated circuit, in accordance with some embodiments.
Figure 5B:
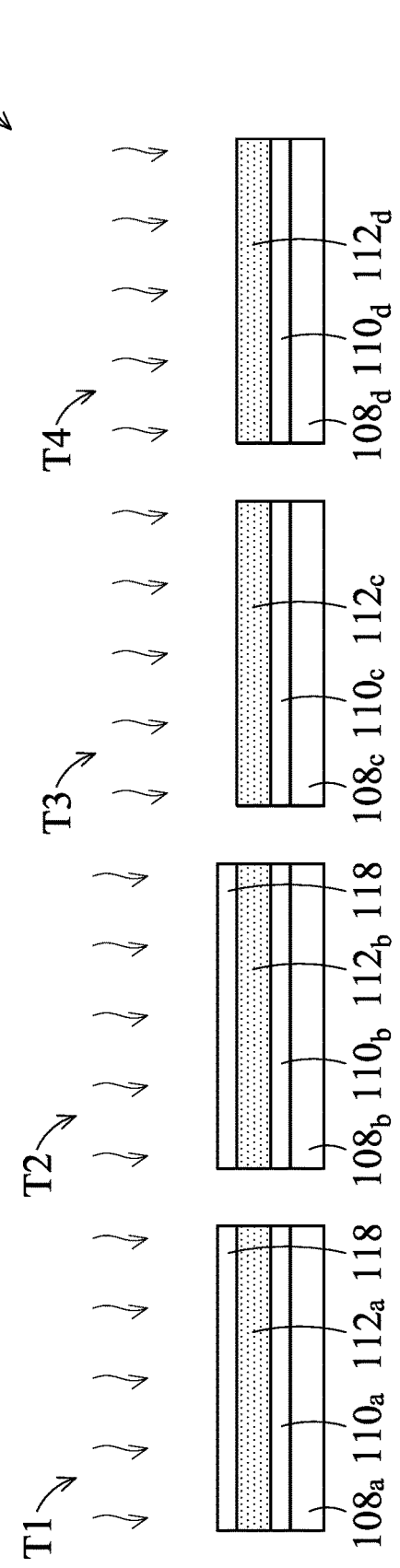
Figure 5C:
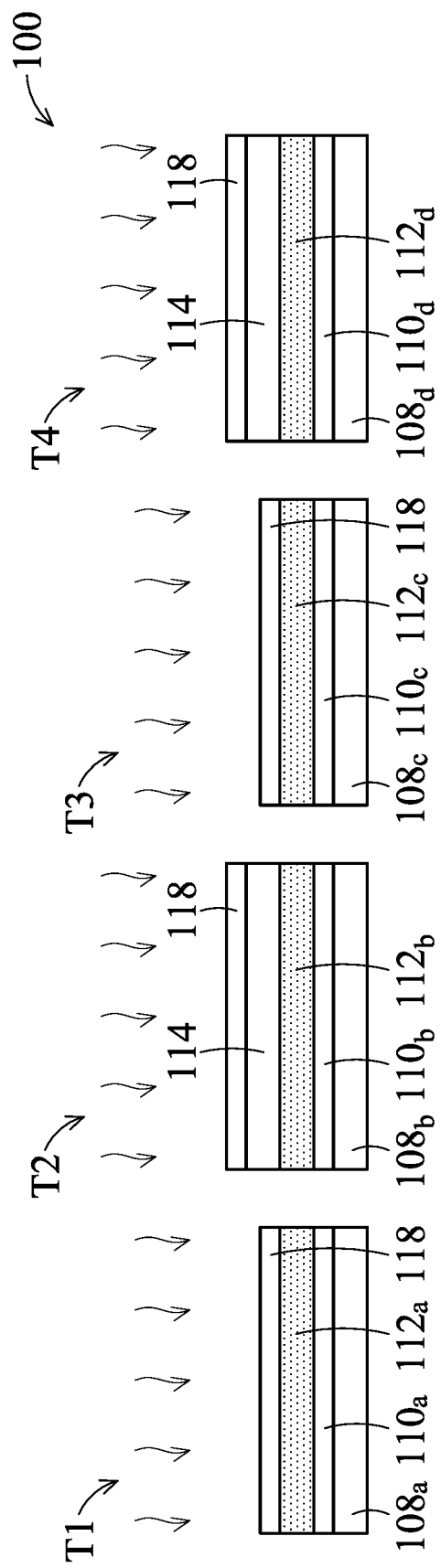

FIGS. 5A-5C are cross-sectional views of an integrated circuit 100 at intermediate stages of processing, in accordance with some embodiments. FIGS. 5A-5C illustrate a process that combines the use of positive tone patterning and reversed tone patterning to provide for transistors (or regions of transistors) T1-T4 with different threshold voltages. FIGS. 5A and 5B illustrate a positive tone patterning dipole drive-in process. FIG. 5C illustrates a reversed tone patterning dipole drive-in process.

In FIG. 5A, a positive tone patterning process begins by depositing the dipole inducing layer 118 directly on the surface of the high K dielectric layer 112a-d for all four transistors T1-T4. The dipole inducing layer 118 can be deposited using materials and deposition processes described in relation to FIG. 1F. A hard mask layer 114 is then deposited on the dipole inducing layer 118 at all of the transistors T1-T4 using processes and materials described in relation to FIG. 1B. A layer of photoresist 116 is then deposited on the hard mask layer 114 is in processes described in relation to FIG. 1C. The layer of photoresist 116 is then patterned to expose the hard mask layer 114 at the transistors T3 and T4 using processes described in relation to FIG. 1D. The hard mask layer 114 is then etched in the presence of the patterned photoresist as described in relation to FIG. 1E. The result is that the hard mask layer 114 is removed at the transistors T3 and T4, exposing the dipole inducing layer 118 of the transistors T3 and T4. These steps results in the structures shown in FIG. 5A.

In FIG. 5B, an etching process is performed in the presence of the hard mask layer 114 and the layer of photoresist 116 to fully remove the dipole inducing layer 118 of the transistors T3 and T4. An ashing process and then etching process are then performed to remove the remaining layer of photoresist 116 and the remaining hard mask layer 114 of the transistors T1 and T2. This leaves the structure shown in FIG. 5B. In practice, the removal of the dipole inducing layer 118 from the transistors T3 and T4 may occur in the same etching step that removes the hard mask layer 114 from the transistors T3 and T4. A thermal annealing process is then performed to drive the dipoles into the high K dielectric layer 112a/112b of the transistors T1 and T2. The thermal annealing process can be substantially as described in relation to FIG. 1G.

The steps shown in FIGS. 5A and 5B help to illustrate that the dipole inducing layer 118 is initially deposited directly on the high K dielectric 112a-d of all of the transistors T1-T4. Furthermore, the etching and ashing processes that remove the layer of photoresist 116 and the hard mask layer 114 prior to the thermal annealing process can result in damage to the high K dielectric layer 112c/112d of the transistors T3 and T4. While this may be undesirable in some cases, in some embodiments the damage from a single such positive tone patterning process may result in a small enough amount of damage to the high K dielectric layer 112d to be acceptable. Because the subsequent dipole inducing process is a reversed tone patterning process that causes no damage to the high K dielectric layer 112d, the combination of a positive tone and a reversed tone patterning process can result in four different threshold voltages with an acceptable amount of damage.

In FIG. 5C, a reversed tone patterning process has been performed as described in relation to FIG. 3B. This results in the dipole inducing layer 118 being formed directly on the surface of the high K dielectric layer 112a/112c of the transistors T1 and T3 and on the hard mask layer 114 of the transistors T2 and T4. A thermal annealing process is then performed to drive the dipoles into the high K dielectric layer 112a/112c and the interfacial dielectric layer 110a/110c of the transistors T1 and T3.

The FIGS. 5A-5C, the transistor T1 receives both the first and second dipole inducing processes and has a threshold voltage Vt1. The transistor T2 has received only the first dipole inducing process and has a threshold voltage Vt2. The transistor T3 has received only the second dipole inducing process and has a threshold voltage Vt3. The transistor T4 has not received either of the dipole inducing processes and has a threshold voltage Vt4.

Figure 6A:
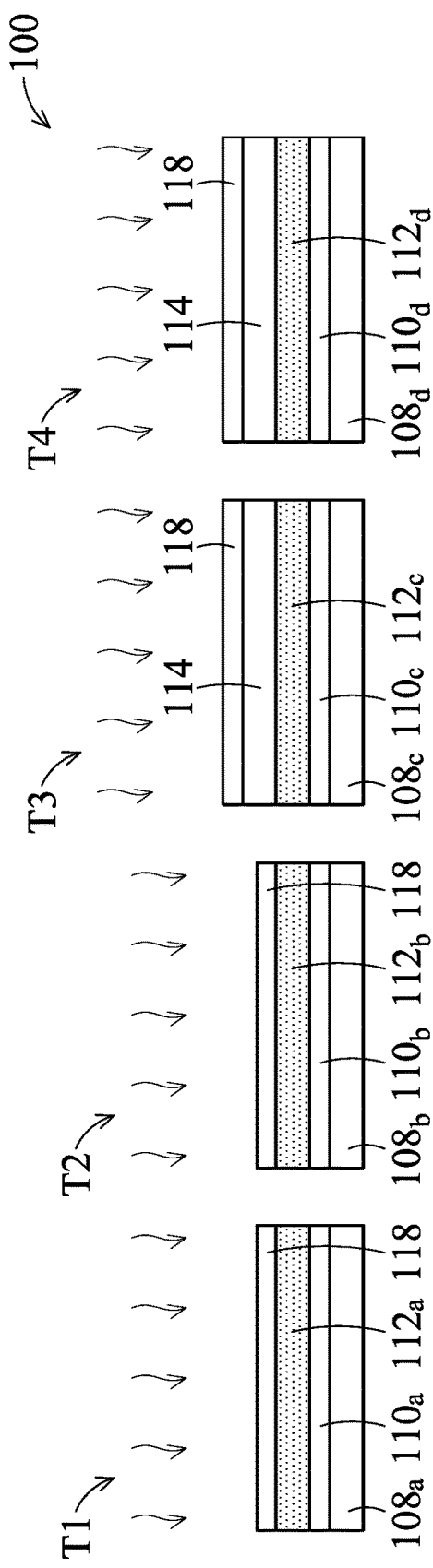
FIGS. 6A-6C are cross-sectional views of an integrated circuit, in accordance with some embodiments.
Figure 6B:
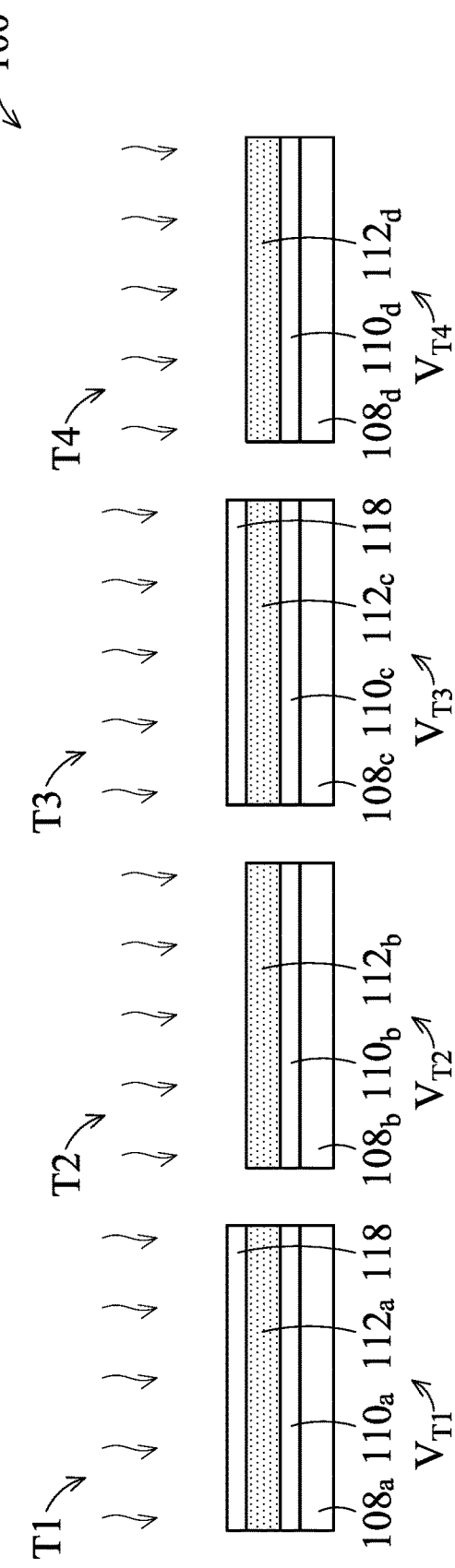
Figure 6C:
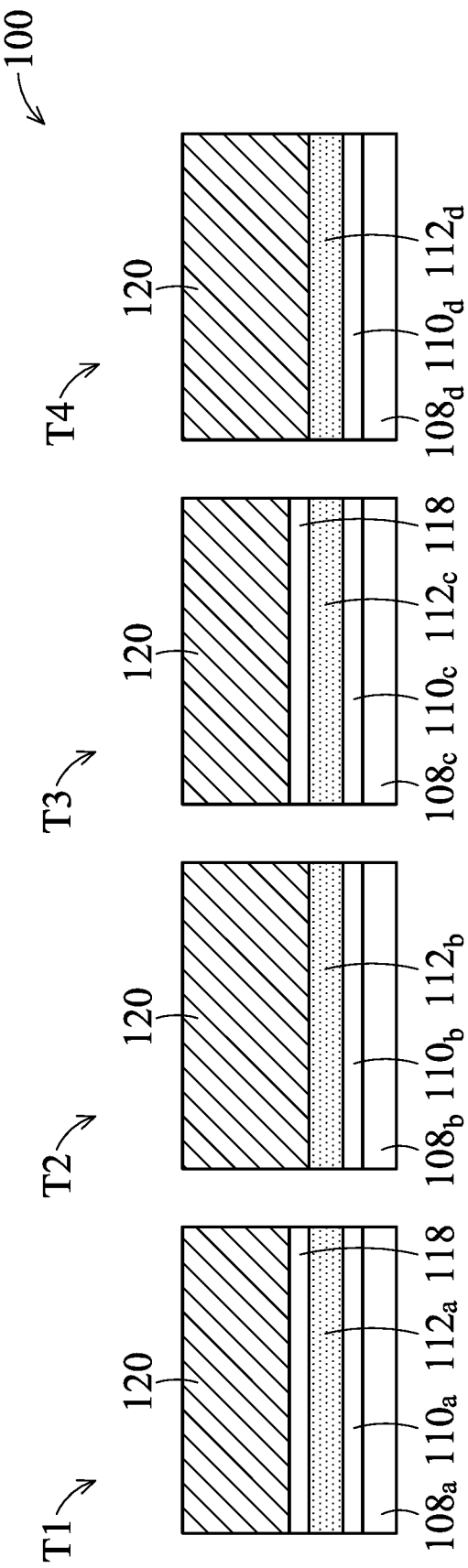

FIGS. 6A-6C are cross-sectional views of an integrated circuit 100 at intermediate stages of processing, in accordance with some embodiments. FIGS. 6A and 6B illustrate a process for forming for transistors T1-T4 each having different threshold voltages. The process of FIGS. 6A and 6B is similar to the process of FIGS. 5A-5C, except that the reversed tone patterning process is performed first and the positive tone patterning process is performed second.

In FIG. 6A a reversed tone patterning process has been performed substantially as described in relation to FIG. 3A. The dipole inducing layer 118 is directly on the surface of the high K dielectric layer 112a/112b of the transistors T1 and T2. The hard mask layer 114 is between the high K dielectric layer 112c/112d and the dipole inducing layer 118 of the transistors T3 and T4. The thermal annealing process is performed to drive the dipoles into the high K dielectric layer 112a/112b and the interfacial dielectric layer 110a/110b at the transistors T1 and T2 while the hard mask layer 114 protects the high K dielectric layer 112c/112d from the dipole drive-in process at the transistors T3 and T4.

In FIG. 6B a positive tone patterning processes been performed as described in relation to FIGS. 5A and 5B. The dipole inducing layer 118 is positioned on the high K dielectric layer 112a/112c at the transistors T1 and T3. The dipole inducing layer 118 has been removed at the transistors T2 and T4. The thermal annealing drive-in process is then performed to drive the dipoles into the high K dielectric layer 112a/112c and the interfacial dielectric layer 110a/110c at the transistors T1 and T3. The result of the process of FIGS. 6 a and 6B is that the transistor T1 has a threshold voltage Vt1, the transistor T2 has a threshold voltage Vt2, the transistor T3 has a threshold voltage Vt3, the transistor T4 has a threshold voltage Vt4.

FIG. 6C illustrates an embodiment in which the gate metal 120 is deposited while the dipole inducing layer 118 is still present at the transistors T1 and T3. The gate metal can have materials and deposition processes described in relation to FIG. 1I. In embodiments in which the final patterning process is a positive tone patterning process, the gate metal 120 can be deposited directly on the dipole inducing layer 118 because the hard mask layer 114 is no longer present at any of the transistors. Accordingly, the gate metal 120 is directly in contact with the dipole inducing layer 118 of the transistors T1 and T3 and directly in contact with the high K dielectric layer 112b/112d at the transistors T2 and T4. Alternatively, the dipole inducing layer 118 can be removed from all transistors prior to depositing the gate metal 120.

A mixture of positive tone patterning and reversed tone patterning processes can be utilized to produce transistors T1-T8 having a different threshold voltages. In some embodiments, a first dipole drive-in process may include a positive tone patterning process, while the second and third dipole drive-in processes may both include reversed tone patterning processes. In some embodiments, the first and third dipole drive-in process may include reversed tone patterning processes while the second dipole drive-in process includes a positive tone patterning process. In some embodiments, the first and second dipole drive-in processes may include reversed tone patterning processes while the final dipole drive-in process may include a positive tone patterning process. In some embodiments, two positive tone patterning processes and a single reversed tone patterning process may be utilized.

Figure 7:
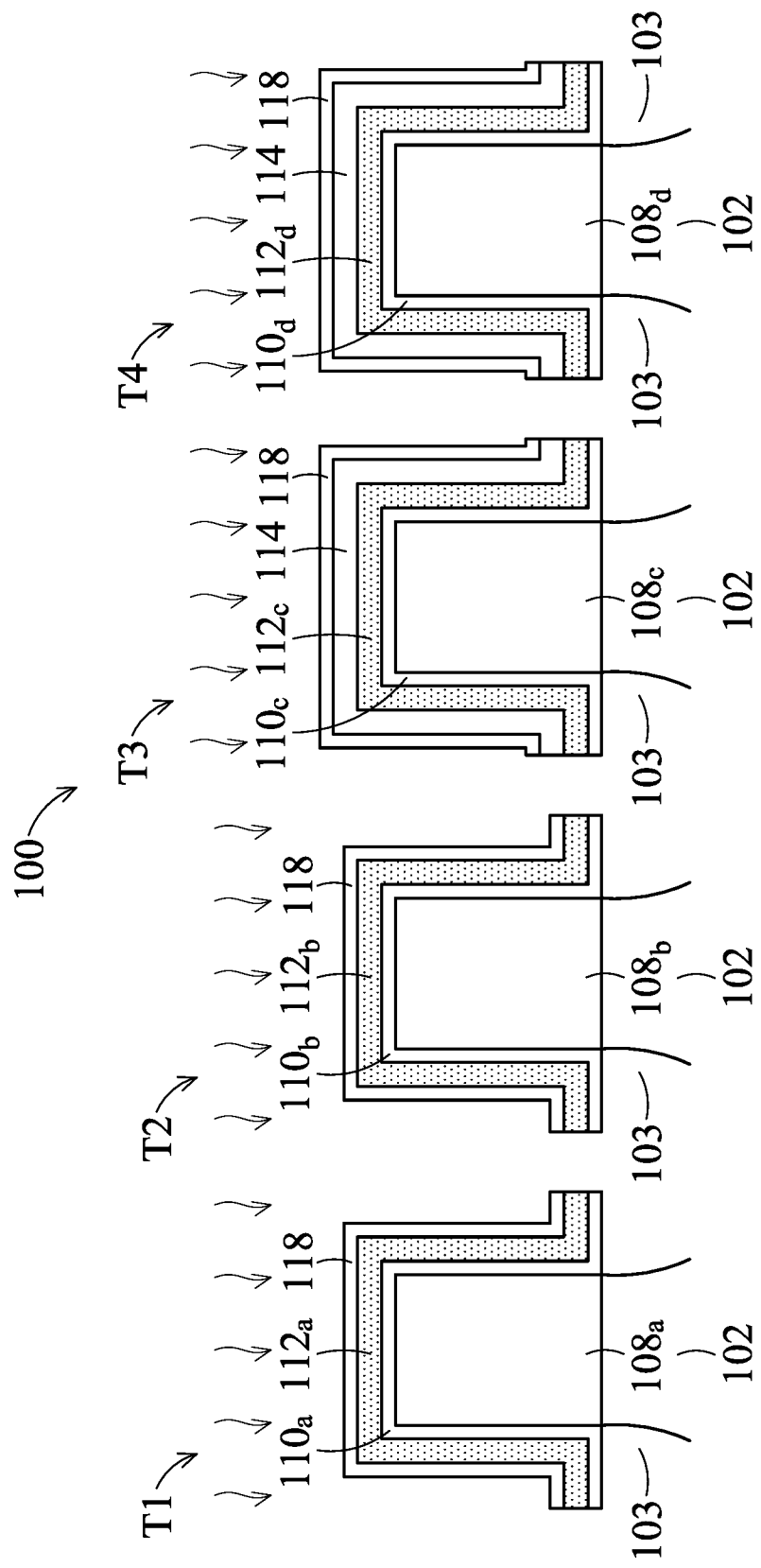
FIG. 7 is a cross-sectional view of an integrated circuit, in accordance with some embodiments.

FIG. 7 is a cross-sectional view of an integrated circuit 100, in accordance with some embodiments. The integrated circuit 100 includes four FinFET transistors T1-T4 at an intermediate stage of processing. Each FinFET transistor T1-T4 includes a channel region 108a-d. The channel region 108a-d can include the materials described in relation to the channel regions 108a-b of FIG. 1A. The interfacial dielectric layer 110a-d is on the side and top surfaces of the channel region 108a-d for each transistor. The high K dielectric layer 112a-d is on the interfacial dielectric layer 110a-d. A substrate 102 is positioned below the channel regions 108a-d. Shallow trench isolation regions 103 are also present.

The stage of processing shown in FIG. 7 corresponds to the stage of processing shown in FIG. 1G. In particular, a reversed tone patterning process has been performed. The dipole inducing layer 118 is positioned on the high K dielectric layer 112a/112b of the transistors T1 and T2. The hard mask layer 114 is on the high K dielectric layer 112c/112d of the transistors T3 and T4. The dipole inducing layer 118 is positioned on the hard mask layer 114 of the transistors T3 and T4. The thermal annealing process is performed to drive the dipoles into the high K dielectric layer 112a/112b and the interfacial dielectric layer 110a/110b of the transistors T1 and T2, thereby changing the threshold voltage of the transistors T1 and T2. The threshold voltage of the transistors T3 and T4 remains unchanged due to the presence of the hard mask layer 114.

Though not shown, the second reversed tone patterning process and the dipole drive-in process of FIG. 3B can be performed to drive dipoles into the high K dielectric layer 112a/112c and interfacial dielectric layer 110a/110c of the transistors T1 and T3, resulting different threshold voltages for each of the transistors T1-T4. In some embodiments, a positive tone patterning process can be performed on the FinFET transistors for the second dipole drive-in process. In some embodiments, a positive tone patterning process can be performed first and then a reversed tone the patterning process can be performed second. Various combinations of the processes described herein can be utilized to pattern the FinFET transistors of FIG. 7. A gate metal 120 can be deposited over the FinFET transistors after all of the dipole drive-in processes have been performed.

The process for forming FinFET transistors can include patterning a semiconductor substrate 102 to form semiconductor fins. Shallow trench isolation regions 103 are then formed around the fins. Dummy gate structures and sidewall spacers 136 are then formed across the fins. Source/drain recesses are then formed in the fins. The source/drain regions 128 are then formed in the recesses. An interlevel dielectric layer can then be deposited, followed by removal of the dummy gate to form a gate trench. The interfacial dielectric layer 110a-d and the high K dielectric layer 112a-d are then formed on the exposed portions of the fin, corresponding to the channel regions. Reversed tone patterning processes can be utilized for driving dipoles in order to generate different threshold voltages in the FinFET transistors. In some embodiments, a positive tone patterning process can also be utilized in combination with a reversed tone patterning process. The gate metal 120 is then deposited over the high K dielectric layer 112a-d. Various other processes can be utilized to form FinFET transistors without departing from the scope of the present disclosure.

Figure 8:
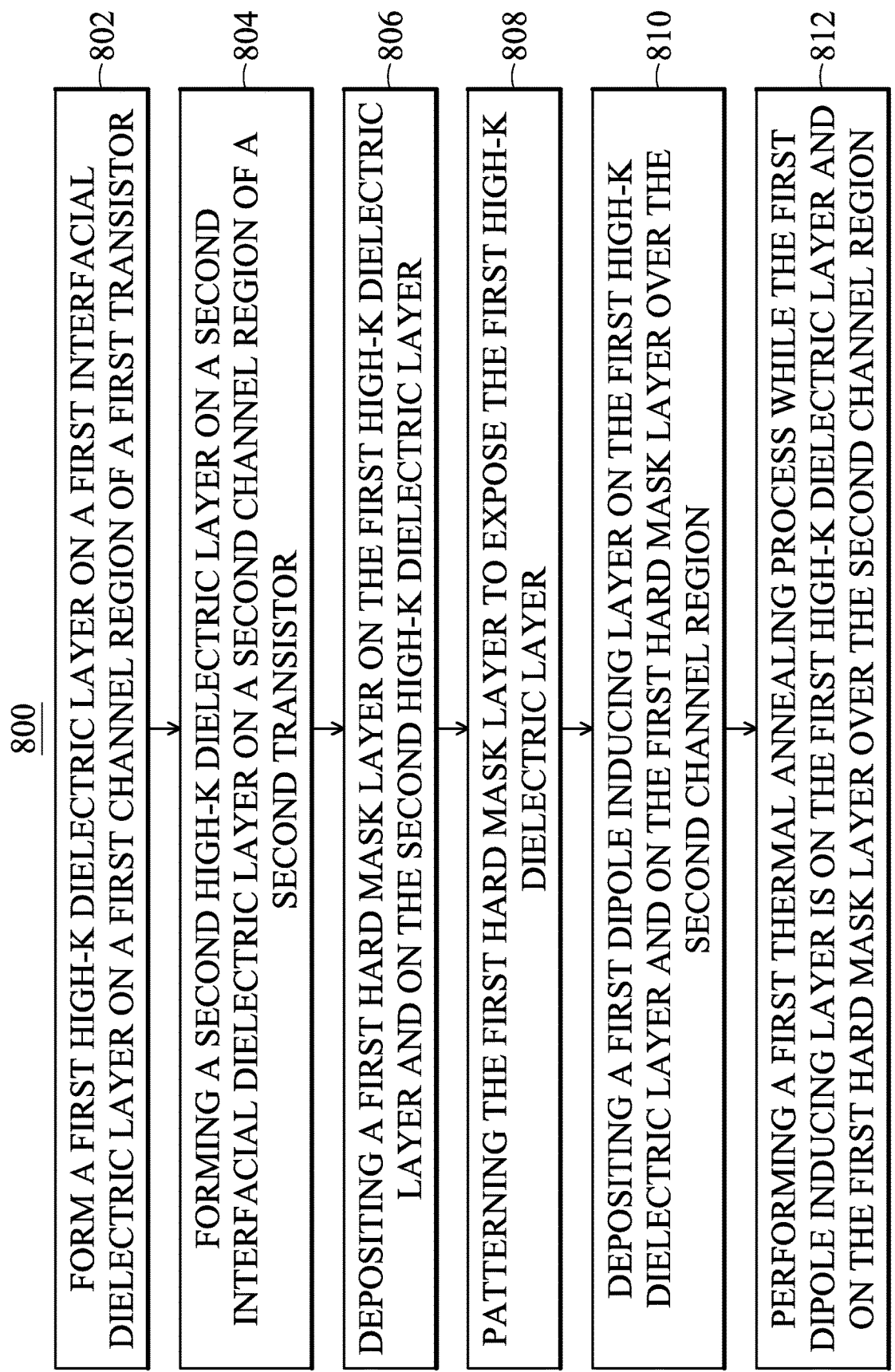
FIG. 8 is a flow diagram of a method for processing an integrated circuit, in accordance with some embodiments.

FIG. 8 is a flow diagram of a method 800 for processing an integrated circuit, in accordance with some embodiments. The method 800 can utilize processes, components, and systems described in relation to FIGS. 1A-7. At 802, the method 800 includes forming a first high-K dielectric layer on a first interfacial dielectric layer on a first channel region of a first transistor. One example of a first transistor is the transistor T1 of FIG. 1A. One example of a first channel region is the channel region 108a of FIG. 1A. One example of a first interfacial dielectric layer is the interfacial dielectric layer 110a of FIG. 1A. One example of a first high K dielectric layer is the high K dielectric layer 112a of FIG. 1A.

At 804, the method 800 includes forming a second high-K dielectric layer on a second interfacial dielectric layer on a second channel region of a second transistor. One example of a second transistor is the transistor T2 of FIG. 1A. One example of a second channel region is the channel region 108b of FIG. 1A. One example of a second interfacial dielectric layer is the interfacial dielectric layer 110b of FIG. 1A. One example of a second high K dielectric layer is the high K dielectric layer 112b of FIG. 1A.

At 806, the method 800 includes depositing a first hard mask layer on the first high-K dielectric layer and on the second high-K dielectric layer. One example of a first hard mask layer is the hard mask layer 114 of FIG. 1B.

At 808, the method 800 includes patterning the first hard mask layer to expose the first high-K dielectric layer.

At 810, the method 800 includes depositing a first dipole inducing layer on the first high-K dielectric layer and on the first hard mask layer over the second channel region. One example of a first dipole inducing layer is the first dipole inducing layer 118 of FIG. 1F. At 812, the method 800 includes performing a first thermal annealing process while the first dipole inducing layer is on the first high-K dielectric layer and on the first hard mask layer over the second channel region.

Figure 9:
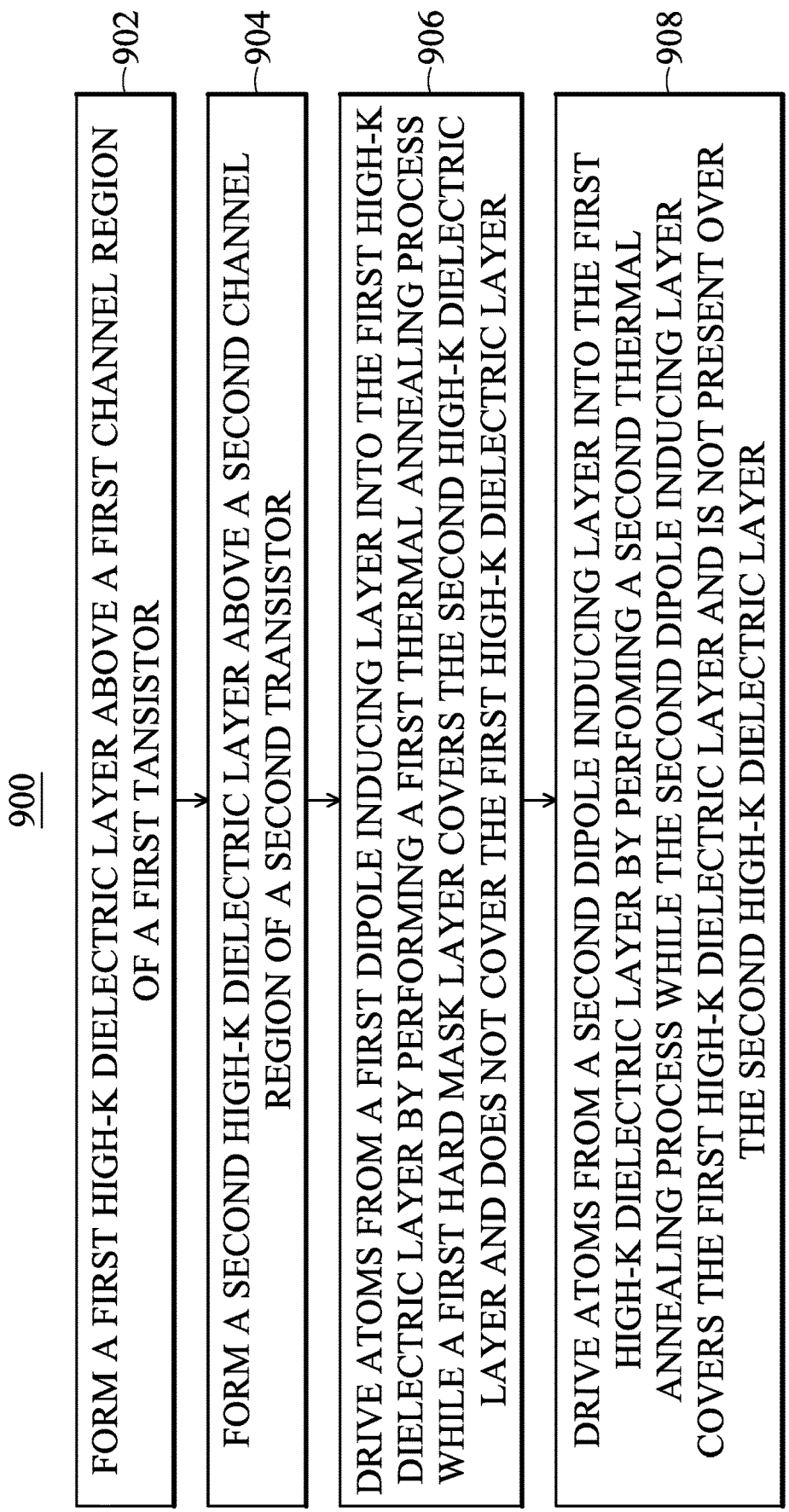
FIG. 9 is a flow diagram of a method for processing an integrated circuit, in accordance with some embodiments.

FIG. 9 is a flow diagram of a method 900 for processing an integrated circuit, in accordance with some embodiments. The method 900 can utilize processes, components, and systems described in relation to FIGS. 1A-8. At 902, the method 900 includes forming a first high-K dielectric layer above a first channel region of a first transistor. One example of a first transistor is the transistor T1 of FIG. 1A. One example of a first channel region is the channel region 108a of FIG. 1A. One example of a first high K dielectric layer is the high K dielectric layer 112a of FIG. 1A.

At 904, the method 900 includes forming a second high-K dielectric layer above a second channel region of a second transistor. One example of a second transistor is the transistor T2 of FIG. 1A. One example of a second channel region is the channel region 108b of FIG. 1A. One example of a second high K dielectric layer is the high K dielectric layer 112b of FIG. 1A.

At 906, the method 900 includes driving atoms from a first dipole inducing layer into the first high-K dielectric layer by performing a first thermal annealing process while a first hard mask layer covers the second high-K dielectric layer and does not cover the first high-K dielectric layer. One example of a first hard mask layer is the hard mask layer 114 of FIG. 1B. One example of a first dipole inducing layer is the dipole inducing layer 118 of FIG. 1F. At 908, the method 900 includes driving atoms from a second dipole inducing layer into the first high-K dielectric layer by performing a second thermal annealing process while the second dipole inducing layer covers the first high-K dielectric layer and is not present over the second high-K dielectric layer. One example of a second dipole inducing layer is the dipole inducing layer 118 of FIG. 5A.

Embodiments of the present disclosure provide an integrated circuit with multiple regions of the transistor formation with different threshold voltages. In particular, embodiments of the present disclosure utilize reversed tone patterning to safely and effectively perform dipole drive-in processes that do not significantly damage the high K gate dielectric layers. Embodiments of the present disclosure can utilize combinations of reversed tone and positive tone patterning in order to form the multiple threshold voltage regions. The result is effective and efficient formation of multiple threshold voltage regions the falcon specified tolerances. This leads to properly functioning integrated circuits, higher wafer yields, and better functioning electronic devices.

In some embodiments, a method includes forming a first high-K dielectric layer on a first interfacial dielectric layer on a first channel region of a first transistor, forming a second high-K dielectric layer on a second interfacial dielectric layer on a second channel region of a second transistor, and depositing a first hard mask layer on the first high-K dielectric layer and on the second high-K dielectric layer. The method includes patterning the first hard mask layer to expose the first high-K dielectric layer, depositing a first dipole inducing layer on the first high-K dielectric layer and on the first hard mask layer over the second channel region, and performing a first thermal annealing process while the first dipole inducing layer is on the first high-K dielectric layer and on the first hard mask layer over the second channel region.

In some embodiments, a method includes forming a first high-K dielectric layer above a first channel region of a first transistor and forming a second high-K dielectric layer above a second channel region of a second transistor. The method includes driving atoms from a first dipole inducing layer into the first high-K dielectric layer by performing a first thermal annealing process while a first hard mask layer covers the second high-K dielectric layer and does not cover the first high-K dielectric layer. The method includes driving atoms from a second dipole inducing layer into the first high-K dielectric layer by performing a second thermal annealing process while the second dipole inducing layer covers the first high-K dielectric layer and is not present over the second high-K dielectric layer.

In some embodiments, an integrated circuit includes a first transistor having a first threshold voltage. The first transistor includes a plurality of stacked first channel regions and a first high-K dielectric layer surrounding each of the first channel regions, wherein the first high-K dielectric layer is thinner on a top side of a highest first channel region than on a bottom side of the highest first channel region. The integrated circuit includes a second transistor having a second threshold voltage different than the first threshold voltage. The second transistor includes a plurality of stacked second channel regions and a second high-K dielectric layer surrounding each of the second channel regions. The second high-K dielectric layer has a same thickness on a top side of a highest second channel region as on a bottom side of the highest second channel region. The thickness of the second high-K dielectric layer is greater on the top side of the highest second channel region than the thickness of the first high-K dielectric layer on the bottom side of the highest first channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first high-K dielectric layer on a first interfacial dielectric layer on a first channel region of a first transistor;
    forming a second high-K dielectric layer on a second interfacial dielectric layer on a second channel region of a second transistor;
    depositing a first hard mask layer on the first high-K dielectric layer and on the second high-K dielectric layer;
    patterning the first hard mask layer to expose the first high-K dielectric layer;
    depositing a first dipole inducing layer on the first high-K dielectric layer and on the first hard mask layer over the second channel region; and
    performing a first thermal annealing process while the first dipole inducing layer is on the first high-K dielectric layer and on the first hard mask layer over the second channel region.

2. The method of claim 1, comprising adjusting a threshold voltage of the first transistor by performing the first thermal annealing process.

3. The method of claim 2, wherein the first thermal annealing process does not adjust a threshold voltage of the second transistor.

4. The method of claim 1, comprising:
    removing the first dipole inducing layer and remaining portions of the first hard mask layer; and
    depositing a gate metal on the first high-K dielectric layer and on the second high-K dielectric layer.

5. The method of claim 2, comprising:
    forming a third high-K dielectric layer on a third interfacial dielectric layer on a third channel region of a third transistor prior to depositing the first hard mask layer;
    forming a fourth high-K dielectric layer on a fourth interfacial dielectric layer on a fourth channel region of a fourth transistor prior to depositing the first hard mask layer;
    wherein depositing the first hard mask layer includes depositing the first hard mask layer on the third high-K dielectric layer and on the fourth high-K dielectric layer;
    wherein patterning the first hard mask layer includes exposing the third high-K dielectric layer;
    wherein depositing the first dipole inducing layer includes depositing the first dipole inducing layer on the third high-K dielectric layer and on the first hard mask layer over the fourth high-K dielectric layer; and
    wherein performing the first thermal annealing process includes performing the first thermal annealing process while the first dipole inducing layer is on the third high-K dielectric layer and on the first hard mask layer over the fourth channel region.

6. The method of claim 5, comprising:
    removing the first hard mask layer and the first dipole inducing layer;
    depositing a second hard mask layer on the first, second, third, and fourth high-K dielectric layers;
    exposing the first and fourth high-K dielectric layers by patterning the second hard mask layer;
    depositing a second dipole inducing layer on the first and fourth high-K dielectric layers and on the second hard mask layer over the second and third channel regions; and
    performing a second thermal annealing process while the second dipole inducing layer is on the first and fourth high-K dielectric layers.

7. The method of claim 6, wherein performing the first and second thermal annealing processes causes the first, second, third, and fourth transistors to each have different threshold voltages from each other.

8. The method of claim 7, wherein the first and second thermal annealing processes does not change the threshold voltage of the second transistor.

9. The method of claim 5, comprising:
removing the first hard mask layer and the first dipole inducing layer;
depositing a second dipole inducing layer on the first, second, third, and fourth high-K dielectric layers;
depositing a second hard mask layer on the second dipole inducing layer over the first, second, third, and fourth high-K dielectric layers;
exposing the second dipole inducing layer over the second and third high-K dielectric layers by patterning the second hard mask layer;
removing the second dipole inducing layer from the second and third high-K dielectric layers while the second hard mask layer is on the second dipole inducing layer on the first and fourth high-K dielectric layers; and
performing a second thermal annealing process after removing the second dipole inducing layer from the second and third high-K dielectric layers and while the second dipole inducing layer is on the first and fourth high-K dielectric layers.

10. The method of claim 9, wherein the first and second thermal annealing processes does not change the threshold voltage of the second transistor.

11. A method, comprising:
forming a first high-K dielectric layer above a first channel region of a first transistor;
forming a second high-K dielectric layer above a second channel region of a second transistor; and
driving atoms from a first dipole inducing layer into the first high-K dielectric layer by performing a first thermal annealing process while a first hard mask layer covers the second high-K dielectric layer and does not cover the first high-K dielectric layer and while the first dipole inducing layer covers the first hard mask layer; and
forming a gate metal surrounding the first channel region and the second channel region, wherein the second high-K dielectric layer is positioned between the gate metal and the second channel regions, wherein an intermixing layer is positioned on the second high-K dielectric layer in contact with the gate metal, wherein the intermixing layer includes material from the second high-K dielectric layer and the first hard mask layer.

12. The method of claim 11, comprising driving atoms from a second dipole inducing layer into the first high-K dielectric layer by performing a second thermal annealing process while the second dipole inducing layer covers the first high-K dielectric layer and is not present over the second high-K dielectric layer, wherein a threshold voltage of the first transistor is changed by the first thermal annealing process and is changed by the second thermal annealing process, wherein a threshold voltage of the second transistor is not changed by the first thermal annealing process and is not changed by the second thermal annealing process.

13. The method of claim 12, comprising performing the first thermal annealing process after performing the second thermal annealing process.

14. The method of claim 12, comprising performing the second thermal annealing process after performing the first thermal annealing process.

15. The method of claim 12, comprising:
forming a third high-K dielectric layer on a third interfacial dielectric layer on a third channel region of a third transistor prior to performing the first thermal annealing process and prior to performing the second thermal annealing process;
forming a fourth high-K dielectric layer on a fourth interfacial dielectric layer on a fourth channel region of a fourth transistor prior to performing the first thermal annealing process and prior to performing the second thermal annealing process;
driving atoms from the first dipole inducing layer into the third high-K dielectric layer by performing the first thermal annealing process while the first hard mask layer covers the fourth high-K dielectric layer and does not cover the third high-K dielectric layer; and
driving atoms from the second dipole inducing layer into the fourth high-K dielectric layer by performing the second thermal annealing process while the second dipole inducing layer is not present over the second high-K dielectric layer.

16. The method of claim 15, wherein the first dipole inducing layer is on the first hard mask layer over the second and fourth high-K dielectric layers during the first thermal annealing process.

17. The method of claim 16, wherein the second dipole inducing layer is not present over the third high-K dielectric layer during the second thermal annealing process.

18. A method, comprising:
forming a first high-K dielectric layer on a plurality of first stacked channel regions of a first transistor;
forming a second high-K dielectric layer on a plurality of second stacked channel regions of a second transistor;
forming a hard mask layer on the second high-K dielectric layer;
depositing a first dipole inducing layer in direct contact with the first high-K dielectric layer and separated from the second high-K dielectric layer by the hard mask layer;
performing a thermal annealing process while the first dipole inducing layer is present on the first high-K dielectric layer and on the hard mask layer; and
forming a gate metal surrounding the first stacked channels and the second stacked channels, wherein the second high-K dielectric layer is positioned between the gate metal and the second channel regions, wherein an intermixing layer is positioned on the second high-K dielectric layer in contact with the gate metal, wherein the intermixing layer includes material from the second high-K dielectric layer and the hard mask layer.

19. The method of claim 18, wherein the first high-K dielectric layer has a different dipole concentration than the second high-K dielectric layer.

20. The method of claim 18, comprising adjusting a threshold voltage of the first transistor by performing the thermal annealing process.

* * * * *